(12) United States Patent
More et al.

(10) Patent No.: US 12,424,491 B2
(45) Date of Patent: *Sep. 23, 2025

(54) SEMICONDUCTOR DEVICE WITH LOW-GALVANIC CORROSION STRUCTURES, AND METHOD OF MAKING SAME

(71) Applicant: TAIWAN SEMICONDUCTOR MANUFACTURING COMPANY, LTD., Hsinchu (TW)

(72) Inventors: Shahaji B. More, Hsinchu (TW); Chandrashekhar Prakash Savant, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/190,868

(22) Filed: Mar. 27, 2023

(65) Prior Publication Data
US 2023/0253249 A1 Aug. 10, 2023

Related U.S. Application Data

(63) Continuation of application No. 17/140,414, filed on Jan. 4, 2021, now Pat. No. 11,615,985.

(51) Int. Cl.
*H01L 21/768* (2006.01)
*H01L 21/02* (2006.01)
(Continued)

(52) U.S. Cl.
CPC .. *H01L 21/76861* (2013.01); *H01L 21/02063* (2013.01); *H01L 21/76805* (2013.01);
(Continued)

(58) Field of Classification Search
CPC ......... H01L 21/76861; H01L 21/02063; H01L 21/76805; H01L 21/76814; H01L 21/76834; H01L 21/76846; H01L 21/76849; H01L 21/76871; H01L 21/76895; H01L 21/321; H01L 21/76873; H01L 21/76856; H01L 21/76832;
(Continued)

(56) References Cited

U.S. PATENT DOCUMENTS 7,122,484 B2* 10/2006 Perng ...................... C11D 7/50
257/E21.255
7,260,442 B2 8/2007 Hwang et al.
(Continued)

*Primary Examiner* — Dale E Page
*Assistant Examiner* — Quovaunda Jefferson
(74) *Attorney, Agent, or Firm* — Hauptman Ham, LLP

(57) ABSTRACT

Disclosed are methods for manufacturing semiconductor devices that include the operations of forming a first interconnect segment over a semiconductor substrate, forming a cap layer of a first metal over a top surface of the first interconnect segment, and modifying an exposed surface of the cap layer to form an organometallic film by adding ammonia to the top surface of the cap layer, reacting a portion of the ammonia with residual methyl radicals present on the top surface of the cap layer, and removing hydrogen from both the ammonia and the methyl radicals to form an organometallic film on the cap layer.

20 Claims, 15 Drawing Sheets

(51) Int. Cl.
*H01L 23/532* (2006.01)
*H01L 23/535* (2006.01)

(52) U.S. Cl.
CPC .. *H01L 21/76814* (2013.01); *H01L 21/76834* (2013.01); *H01L 21/76846* (2013.01); *H01L 21/76849* (2013.01); *H01L 21/76871* (2013.01); *H01L 21/76895* (2013.01); *H01L 23/53209* (2013.01); *H01L 23/535* (2013.01)

(58) Field of Classification Search
CPC ......... H01L 21/31111; H01L 23/53209; H01L 23/535; H01L 23/53238; H01L 23/53295; H01L 23/528; H01L 23/5328; H01L 2221/1068; H01L 21/76826
See application file for complete search history.

(56) References Cited

U.S. PATENT DOCUMENTS

| | | | |
|---|---|---|---|
| 9,256,709 | B2 | 2/2016 | Yu et al. |
| 11,615,985 | B2* | 3/2023 | More ................ H01L 21/76834 257/774 |
| 2005/0161338 | A1* | 7/2005 | Fang ................ H01L 21/76874 257/E21.174 |
| 2007/0082491 | A1 | 4/2007 | Uozumi et al. |
| 2008/0251928 | A1 | 10/2008 | Chang et al. |
| 2014/0040838 | A1 | 2/2014 | Liu et al. |
| 2014/0183738 | A1* | 7/2014 | Jezewski ............. H01L 23/5226 438/653 |
| 2015/0278429 | A1 | 10/2015 | Chang |
| 2019/0079409 | A1 | 3/2019 | Takahashi et al. |

* cited by examiner

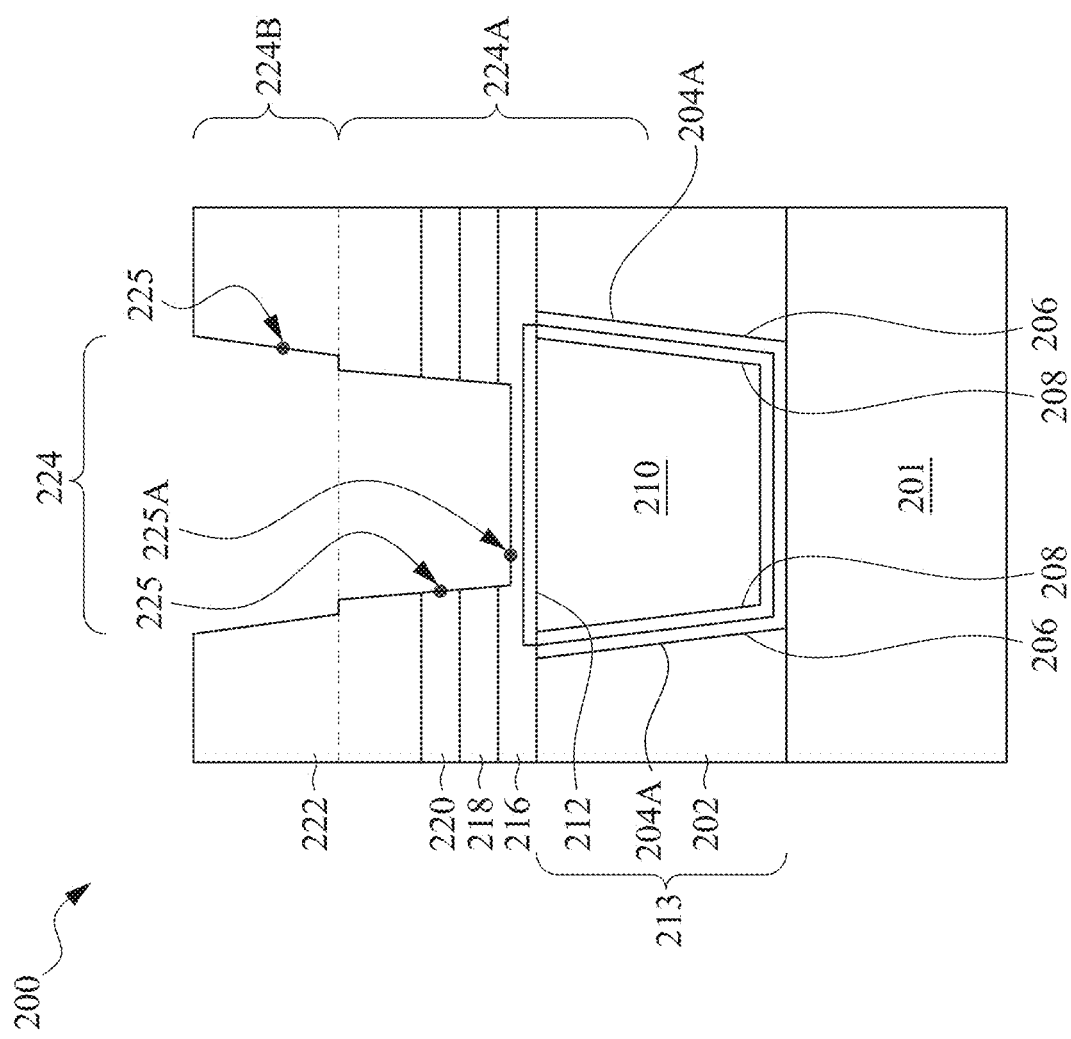

SEMICONDUCTOR DEVICE WITH LOW-GALVANIC CORROSION STRUCTURES, AND METHOD OF MAKING SAME

PRIORITY

This Application is a continuation of U.S. patent application Ser. No. 17/140,414, filed Jan. 4, 2021, which was issued as U.S. Pat. No. 11,615,985 on Mar. 28, 2023, the contents of which are incorporated herein in their entirety.

BACKGROUND

Galvanic corrosion causes voids and pits in conductive material of semiconductor device interconnects which reduces device reliability and useful device lifetime. Galvanic corrosion is caused by charge buildup on a wafer during a semiconductor device manufacturing process. Voids in semiconductor device interconnects contribute to electromigration defects, increased resistance between voltage sources and circuit elements, and mismatched circuit element performance. Galvanic corrosion and pitting are worsened by exposure to strong acids and bases during a manufacturing flow for a semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2G are cross-sectional diagrams of a semiconductor device during various stages of manufacture, in accordance with some embodiments.

DETAILED DESCRIPTION

Figure 1:
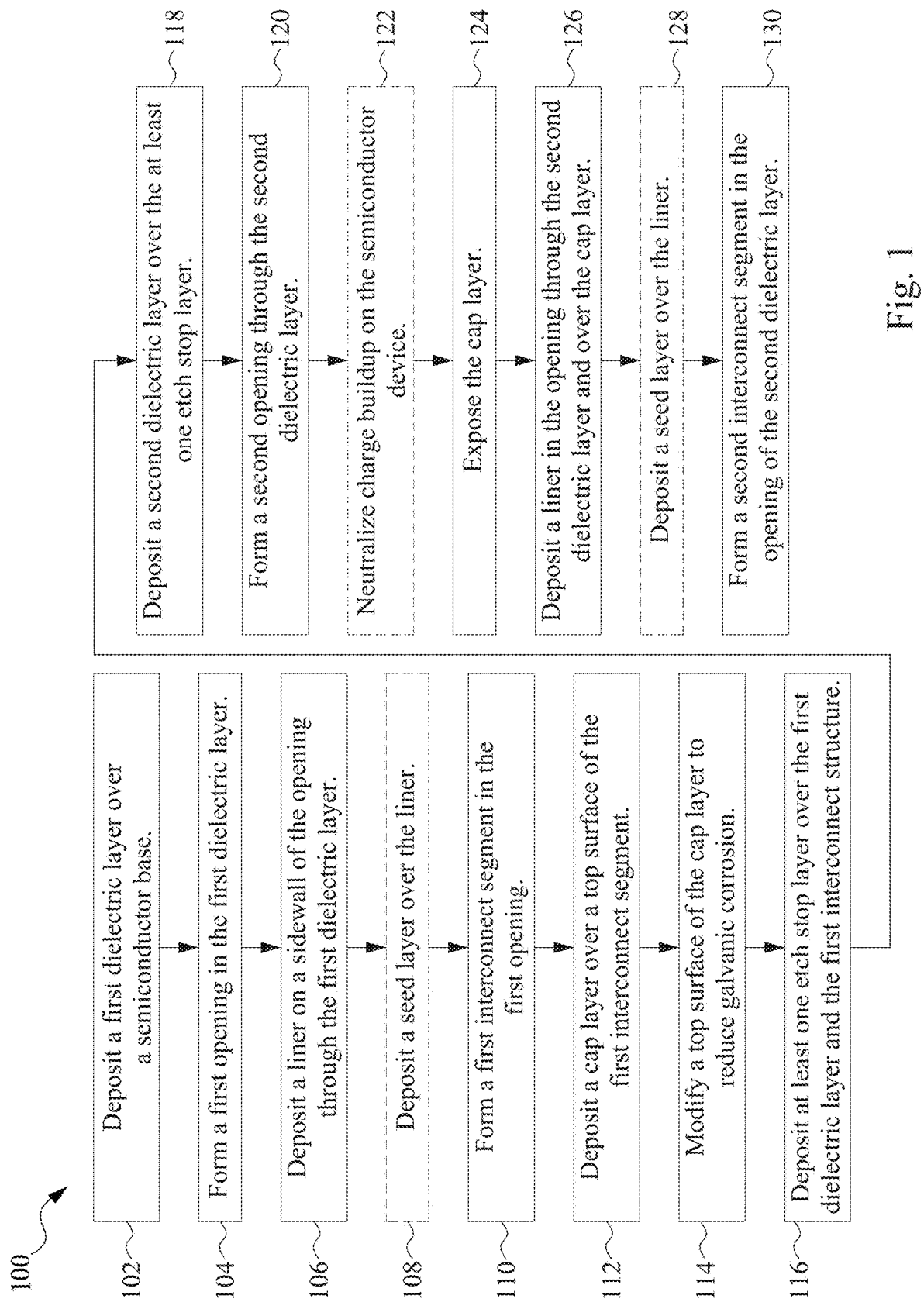
FIG. 1 is a flow diagram of a method of making a semiconductor device, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Voids in interconnect structures of semiconductor devices have detrimental effects on the performance of the semiconductor devices. In some instances, voids lead to increased resistance between a voltage source and a circuit element of the semiconductor as the joint area between interconnect segments decreases. In some instances, voids also contribute to the electromigration of conductive material (copper, aluminum, and so forth), leading to breaks or "opens" in the interconnect structure of the semiconductor device, which increases a risk of failure of the semiconductor device. In some instances, voids also contribute to degraded device performance.

In some semiconductor devices, voids are a result of poor fill of a conductive material in an opening through a dielectric layer. In some embodiments, voids are a result of corrosion or pitting of a conductive material deposited in an opening through a dielectric layer. Pitting or corrosion results in a loss of conductive material at the site of the pit, or at corners of the interconnect segment, or electromigration of conductive material from other locations in the interconnect segment to the site of the pit or corrosion.

Copper is a conductive material used for semiconductor device interconnect segments. Copper diffusion into a dielectric layer or a semiconductor device base layer, or a semiconductor device substrate, is reduced by depositing a liner layer into openings which are later filled with copper. A liner layer slows diffusion of the copper into the dielectric layer of a semiconductor base layer.

One technique for reducing the formation of voids in copper interconnect segments includes protecting the exposed surface of the copper interconnect segment with a cap layer. A cap layer is a layer of conductive material which is deposited, or grown, on the top surface of the copper interconnect segment to reduce or prevent corrosion or pitting of the copper. Cobalt is used as a cap layer metal because the electropotential of a copper/cobalt junction is small: $\Delta E = E°_{Co} E°_{Cu} = (-0.28V) - (-0.34V) = -0.64V$ compared to the electropotential of other copper/metal junctions. For example, the copper/titanium junction electropotential is: $\Delta E_{(Ti/Cu)} = -1.94V$, and the copper/chromium junction electropotential is: $\Delta E_{(Cr/Cu)} = -0.95V$. Further, cobalt deposition on copper interconnect segments occurs without leaving a residue (or with minimal residue) over a top surface of the dielectric layer adjacent to the interconnect segment, which reduces the frequency of stringer defects and cobalt diffusion into the dielectric layer. A stringer defect is a short circuit between different interconnect segments. Cobalt is also more resistant to pitting than copper, and helps to protect copper interconnect segments from pitting and galvanic corrosion.

The present disclosure describes a method of modifying a top surface of a cap layer, including cobalt cap layers, to make the cap layer more resistant to pitting and galvanic corrosion. The present disclosure further describes a method of neutralizing charge buildup on a wafer during manufacturing of semiconductor devices to reduce pitting and galvanic corrosion. The present disclosure also describes a semiconductor device which reduces electromigration in interconnect structures to increase semiconductor device reliability and lifespan.

FIG. 1 is a flow diagram of a method 100 of making a semiconductor device, according to some embodiments. Method 100 includes operations which are performed to modify a top surface of a cap layer to make the cap layer more resistant to pitting and galvanic corrosion. Method 100 also includes a charge neutralization operation to reduce the frequency and degree of pitting and galvanic corrosion. Method 100 also includes steps for making a semiconductor device having improved electromigration performance, further described below in the discussion of FIGS. 2G, 3B, 3C, and 3D.

Figure 2A:
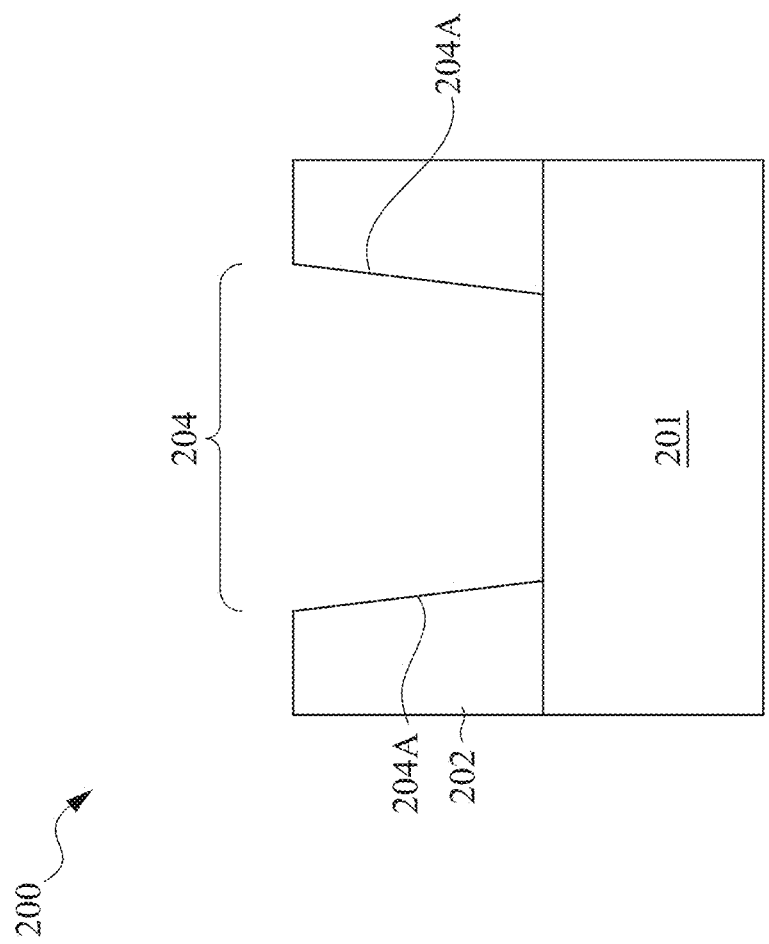

Method 100 includes an operation 102, wherein a first dielectric layer (see, e.g., dielectric layer 202 in FIG. 2A) is deposited over a semiconductor base layer (see, e.g., semiconductor base 201 in FIG. 2A). In some embodiments, the semiconductor base layer includes a substrate of semiconductor material with active areas therein having source regions, drain regions, and channel regions in the active areas. In some embodiments, the semiconductor material includes intrinsic silicon, doped silicon, gallium arsenide (GaAs), silicon germanium (SiGe), or some other semiconductor material suitable for making transistors or other circuit elements for the semiconductor device. In some embodiments, the semiconductor base includes a dielectric layer (different from the first dielectric layer, e.g., dielectric layer 202) deposited over the substrate and having contacts extending through the dielectric layer to make an electrical connection between the circuit elements (e.g., transistors, and so forth) of the semiconductor device and an interconnect segment of the semiconductor device over the semiconductor base.

In some embodiments, the first dielectric layer comprises silicon dioxide ($SiO_2$). Silicon dioxide has a dielectric constant (k) of about 3.9. In some embodiments, the first dielectric layer comprises a low-k dielectric material. A low-k dielectric layer has a dielectric constant below 3.9. In some embodiments, the first dielectric layer comprises a porous dielectric material (e.g., the dielectric layer includes pockets or voids formed after the first dielectric layer is deposited over the substrate). In some embodiments, the openings, or voids, in the first dielectric layer (see, e.g., dielectric layer 202 in FIG. 2A) are formed by, e.g., baking a spin-on dielectric material precursor to drive off solvents in the spin-on dielectric material precursor. In some embodiments, the first dielectric layer contains carbon. In some embodiments, the first dielectric layer is deposited by a chemical vapor deposition process. Examples of low-k dielectric material include silsesquioxanes, which have a dielectric constant ranging from about 1.5 to 2.8, according to some embodiments. In some embodiments, a dielectric constant of a silsesquioxane is a function of the porosity of the material (after curing), the ratio of hydrogen and methyl groups on the organic chains of the material, and the chemical properties of organic or organosilicon copolymers deposited with the silsesquioxane. Other low-k dielectric materials are also suitable for use in semiconductor devices within the scope of the present disclosure.

Method 100 includes an operation 104 in which an opening is formed in the first dielectric layer (see, e.g., dielectric layer 202 in FIG. 2A). Forming an opening in a dielectric layer includes steps of depositing a layer of patterning material over the dielectric layer, transferring a pattern to the layer of patterning material, forming openings in the layer of patterning material to expose the dielectric layer, and performing an etch process to removed exposed portions of the dielectric layer by the openings in the layer of patterning material. In a non-limiting example, FIG. 2A includes an opening 204 in dielectric layer 202 with semiconductor base 201 exposed at the bottom of opening 204. The dielectric layer 202 defines sidewalls 204A of the opening 204.

In some embodiments, the patterning material deposited over the dielectric layer includes photoresist or another material compatible with visible light lithography, ultraviolet light lithography (UV lithography, or UV patterning), electron beam lithography, and other methods of pattern transfer for semiconductor device manufacturing. In some embodiments, the patterning material is a visible-light compatible photoresist. In some embodiments, the patterning material is a UV lithography-compatible patterning material. In some embodiments, the patterning material is a mask material compatible with electron beam pattern transfer techniques. In some embodiments, the layer of patterning material is deposited over the dielectric layer by a spin-on technique and baking the spun-on material to cure the patterning material prior to developing.

In some embodiments, forming openings in the layer of patterning material includes developing the patterning material, where the developing process removes a portion of the layer of patterning material, and leaving behind a mask portion of the layer of patterning material. In some embodiments, the dielectric layer is below the layer of patterning material, and the dielectric layer is exposed within the openings. In some embodiments, a layer of hardmask material is between the layer of patterning material and the dielectric layer, and the layer of hardmask material is exposed at the bottom of the openings. In some embodiments, an etch process is performed to transfer the pattern directly to the dielectric layer. In some embodiments, a first etch process is performed to transfer the pattern to the layer of hardmask material, and a second etch process is performed to transfer the pattern to the dielectric layer. In some embodiments, multiple pattern transfer and etch steps are performed in order to form a dual-damascene type opening for an interconnect segment through the dielectric layer. In some embodiments, a first etch process forms trench openings in the dielectric layer, and a second etch process forms via openings aligned with the trench openings in the dielectric layer.

Figure 2B:
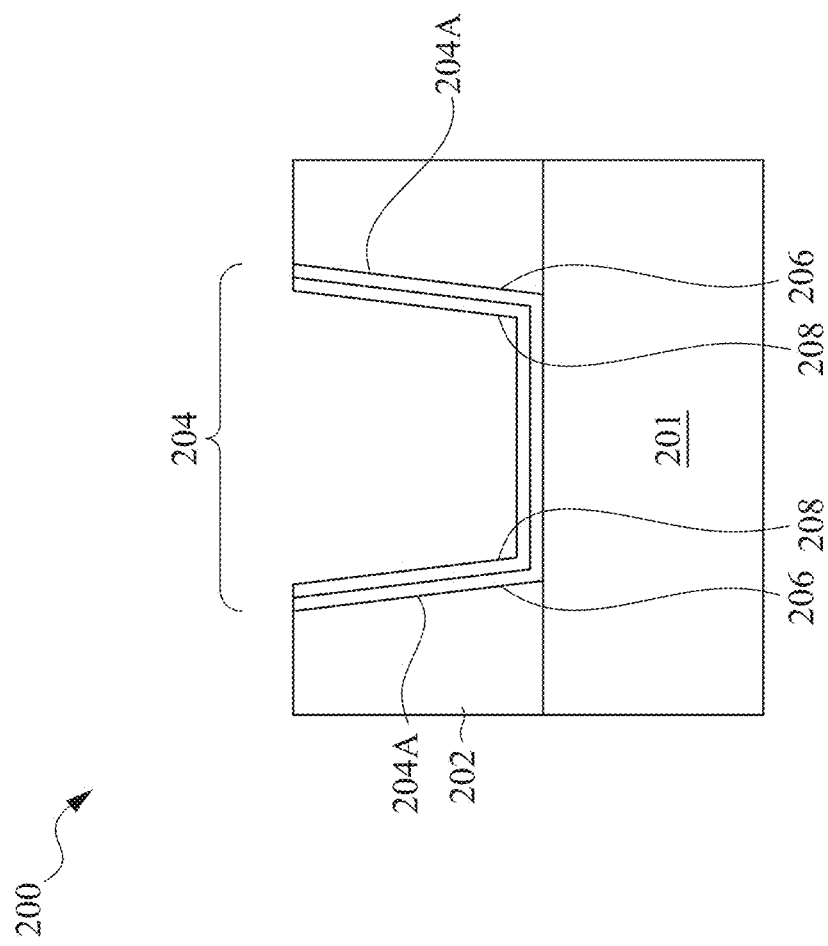

Method 100 includes an operation 106 wherein a liner (a liner layer, or a layer of liner material) is deposited on a sidewall of the opening through the first dielectric layer. In a non-limiting example, FIG. 2B includes a liner 206 deposited against sidewalls of dielectric layer 202 in opening 204. In some embodiments, the dielectric layer is separated from the substrate by an intermediate layer. In some embodiments, the intermediate layer is a different dielectric material than the dielectric layer having the opening therein. In some embodiments, the intermediate layer is a nitride layer. In some embodiments, the intermediate layer is a layer configured to accommodate lattice mismatch between the dielectric layer and the substrate. In some embodiments, depositing a liner over a sidewall of the opening includes performing an atomic layer deposition (ALD) process to grow or deposit the liner material on the dielectric layer. In some embodiments, the liner material is deposited by plasma vapor deposition (PVD). In some embodiments, the PVD process is a sputtering process. In some embodiments, the PVD process is an evaporation process. In some embodiments, the liner material comprises tantalum nitride (TaN), titanium nitride (TiN), niobium nitride (NbN), or another metal nitride which slows or blocks diffusion of interconnect segment metal (e.g., copper, aluminum, and so forth) into dielectric layers of a semiconductor device. In some embodiments, the liner is deposited on both the sidewalls of the opening through the dielectric layer, and on the surface of the semiconductor base exposed at the bottom of the opening through the dielectric layer (e.g., a dielectric layer and/or a contact or other interconnect segment electrically connected to a circuit element of the semiconductor device). In FIG. 2B, liner 206 is deposited both against sidewalls of dielectric layer 202 in opening 204, as well as against a top surface of semiconductor base 201 exposed by the opening 204.

Method 100 includes an optional operation 108 wherein a seed layer is deposited over the liner. In some embodiments, a seed layer is deposited over the liner in order to promote a smooth growth or deposition pattern of the layer of conductive material deposited for the interconnect segment formed in the opening through the dielectric layer. In a non-limiting example, seed layer 208 in FIG. 2B is deposited over liner 206, both on sidewalls in opening 204, over the bottom portion of the liner 206, above semiconductor base 201. In some embodiments, a seed layer is a pure metal. In some embodiments, the seed layer is a metal alloy. In some embodiments, the seed layer comprises cobalt, tantalum, titanium, nickel, niobium, copper, or combination of or another seed layer metal compatible with copper deposition in the opening through the dielectric layer. According to some embodiments, the thickness of the seed layer is different on sidewalls of the opening that over the bottom of the opening. According to some embodiments, thickness of the seed layer on a sidewall ranges from about 5 Ångstroms (Å) to about 50 Å. In some embodiments, thickness of the seed layer is about 20 Å. A thickness of a seed layer less than 5 Å (or, an average thickness of less than 5Å) has incomplete coverage of the liner, where the liner will make electrical contact with conductive material of an interconnect segment after the opening is filled, in some instances. A thickness of the seed layer greater than 50 Å does not produce additional benefits to a semiconductor device, and merely prolongs manufacturing time and increases manufacturing costs, in some instances. In some instances, a seed layer is omitted because the liner layer provides a crystalline structure which promotes good fill of the conductive material for an interconnect segment without inducing strain. In some embodiments, a seed layer is omitted when electromigration at a particular level of a semiconductor device interconnect structure is not a significant source of defects or device failure.

Method 100 includes an operation 110 wherein a first interconnect segment is formed in the opening in the first dielectric layer. Forming a first interconnect segment includes steps related to adding a conductive material to an opening through a dielectric layer. In some embodiments, adding a conductive material to an opening through a dielectric layer includes electroplating. In some embodiments, adding a conductive material to an opening includes performing a sputtering process in some embodiments, adding a conductive material includes performing a PVD process (a sublimation or evaporation-type process). In some embodiments, the conductive material is a pure metal. In some embodiments, the conductive material is a metal alloy. In some embodiments, the conductive material deposited in the opening to form the first interconnect segment comprises copper, aluminum, tungsten, or alloys thereof. According to some embodiments, the conductive material for the interconnect segment is deposited both in the opening through the dielectric layer, and over a top surface of the dielectric layer. Subsequent to deposition of the conductive material, a chemical-mechanical polishing (CMP) step is performed to remove conductive material from the top surface of the dielectric layer, leaving behind a portion of conductive material in the opening (now filled) through the dielectric layer. Thus, after performing a CMP step, interconnect segments embedded in the dielectric layer are electrically isolated from each other and have exposed top surfaces.

Figure 2C:
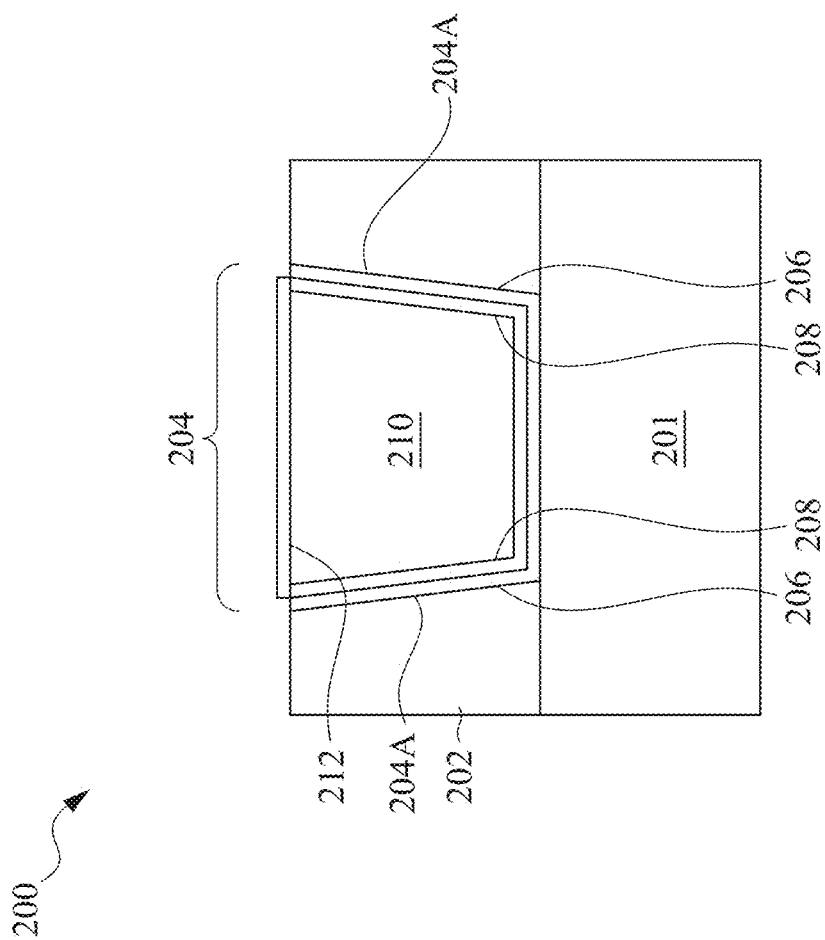

In some embodiments, the first interconnect segment includes a via portion and a trench portion. In some embodiments, the first interconnect segment includes a via portion but no trench portion. In some embodiments, the first interconnect segment includes a trench portion but no via portion. In a non-limiting example, a conductive material 210 of FIG. 2C, described below, is deposited over a liner 206 and a seed layer 208. In a non-limiting example, conductive material 328A is deposited into opening 324D of FIG. 3D, described below. In FIG. 2C, conductive material 210 fills a portion of a first trench (M1) interconnect segment in semiconductor device 200. In FIG. 3D, conductive material 328A fills a via 330 and a trench 332 in an interconnect segment of semiconductor device 355.

Method 100 includes an operation 112 wherein a cap layer is formed on a top surface of the first interconnect segment. A cap layer is formed on a top surface of the first interconnect segment in order to help protect conductive material of the first interconnect segment from pitting or galvanic corrosion. According to some embodiments, the cap layer is formed by depositing a blanket layer of material over a top surface of the dielectric layer and over the interconnect segment, and performing a chemical mechanical polishing step to remove material from over the top surface of the dielectric layer while leaving a portion of the material over the interconnect segment. According to some embodiments, dishing of the conductive material for the interconnect segment recesses the conductive material slightly below the top surface of the dielectric layer, making a blanket deposition/CMP-style process feasible. According to some embodiments, material for a cap layer is grown selectively over a top surface of the conductive material for an interconnect segment using atomic layer deposition (ALD) or some other selective growth process.

In some embodiments, the cap layer is a pure metal. In some embodiments, the cap layer is a metal alloy. In some embodiments, the cap layer is cobalt. In some embodiments, the cap layer is a cobalt alloy. In some embodiments, the cap layer includes one or more of tantalum, titanium, nickel, niobium, and other metals suitable for copper deposition. In some embodiments, the cap layer is made of a same material as the seed layer. In some embodiments of optional operation 108, described above, the cap layer is made from a different material as the seed layer. In some embodiments, the cap layer is formed over a top side of an interconnect segment having a liner and no seed layer.

In some embodiments, a tantalum nitride liner is covered with a cobalt seed layer. A semiconductor device having both a cobalt seed layer and a cobalt cap layer (described below) experiences a significant decrease in the frequency of electromigration defects in the semiconductor device during electrical testing or operation of the semiconductor device, as compared to semiconductor devices which have only a cobalt cap layer, or which have a seed layer which does not include cobalt. In a non-limiting embodiment, semiconductor device 355 of FIG. 3D includes a seed layer 308 and a cap layer 312 which covers a top surface of conductive material 310. Cap layer 312 also covers a top surface (e.g., the upper edge) of seed layer 308. In some embodiments, cap layer 312 also covers a top surface (e.g., the upper edge) of liner 306. Conductive material 310 is physically separated from conductive material 328A, or liner 326 of via 330. Thus, conductive material 310, being encapsulated by the seed layer 308 and the cap layer 312, is configured to have reduced risk of electromigration defects.

In some embodiments, the thickness of the cap layer ranges from 10 Å to 80 Å. Cap layer thicknesses of less than 10 Å are subject to increased frequency of pitting and erosion. Cap layers larger than 80 Å are unnecessarily thick and result in increased manufacturing cost and decreased productivity of a manufacturing process.

Method 100 includes an operation 114 wherein a top surface of the cap layer is modified to reduce galvanic corrosion. In some embodiments, uneven deposition of cap layer material, or defects in the cap layer material after deposition, are associated with pitting or galvanic corrosion of the conductive material below the cap layer, as water or cleaning agents penetrate through the cap layer to the conductive material of the interconnect segment. When water or cleaning agents penetrate through the cap layer to the conductive material, galvanic corrosion results in dissolution of the cap material and/or the conductive material of the interconnect segment. Modifying a top surface of a cap layer is effective at reducing the amount of pitting or galvanic corrosion in a semiconductor device.

Modification of a top surface of the cap layer includes several steps which produce an organometallic coating resistant to water penetration through the cap layer to the conductive material of the interconnect segment. In a non-limiting embodiment, a cobalt cap layer is modified by exposing the cobalt cap layer to ammonia ($NH_3$). According to theory and belief, ammonia forms a van der Waals complex with cobalt atoms at the top surface of the cobalt cap layer. A monolayer of ammonia, complexed with the cobalt atoms at the top surface of the cap layer, provides coverage of the cobalt and prepares for other surface modification treatments to prevent corrosion of the cobalt layer. According to theory and belief, the unbonded valence electrons of the ammonia molecules form van der Waals complexes with the cobalt atom valence electrons which lock the ammonia molecules in place for subsequent processing operations.

Modifying the top surface of cap layer also includes exposing the ammonia-covered cobalt cap layer to methyl radicals ($CH_3{}'$). According to theory and belief, methyl radicals react with the hydrogen atoms of the ammonia molecules in van der Waals complexes. Methyl radicals remove hydrogen atoms, promoting formation of cobalt-nitrogen bonds between the cobalt cap layer and the complexed ammonia molecules. Further reactions between methyl radicals and hydrogen atoms proceed by continuing to remove hydrogen from the ammonia molecule's nitrogen atom (now bonded to the cobalt). During some reactions of methyl radicals, the carbon atom of the methyl radical forms a C—N single bond, which undergoes "promotion" to a double bond or a triple bond according to the amount of hydrogen removed from the ammonia nitrogen atom. According to theory and belief, in some embodiments of the reactions between methyl radicals and the ammonia atoms complexed to the cobalt cap layer, the C—N bond (single, or double) rearranges to a lower energy state and the carbon atom directly bonds to the cobalt cap layer with the nitrogen atom extending outward from the cobalt cap layer (e.g., Co—C—$NH_2$ or Co—C=N—H). According to theory and belief, the final bond structure of the cobalt cap layer is a mixture of Co—$N^+$≡$C^-$ (a higher energy state configuration) and Co—C≡N (a lower energy state configuration), although some hydrogen atoms are present in some embodiments, especially embodiments manufactured without an excess of methyl radicals for hydrogen removal.

Thus, treatment of ammonia-complexed cobalt cap layer surfaces is understood to produce an organometallic (e.g., carbon atoms bonded to metal atoms of the cobalt surface) protective layer which significantly reduces the likelihood of pitting in semiconductor manufacturing processes. According to theory and belief, the organometallic cobalt/carbon/nitrogen cap layer coating at the top surface of the cap layer is understood to be moderately hydrophobic, repelling water and other liquids from the top surface by, e.g., a surface tension modification, to reduce intrusion into the cap layer and to the conductive material. Modifying the top surface of the cap layer includes treating the covered top surface of the cobalt cap layer with carbonated deionized (DI) water to clean the surface before deposition of etch stop layers, as described below in operation 116. In some embodiments of semiconductor devices having modified cobalt cap layers, the loss of cobalt in the cap layer, and seed layers at the sides of the interconnect segment, and void formation in the interconnect segment, is reduced.

A semiconductor device having both a cobalt seed layer and a cobalt cap layer (a "cobalt all around" interconnect segment, including both surface-modified layers and unmodified cap layers) is better able to carry electrical current along an exterior of an interconnect segment, rather than through a bulk structure, resulting in reduced electromigration of the conductive material comprising the bulk of the interconnect segment. In some embodiments, semiconductor devices having interconnect segments both a cobalt seed layer and a cobalt cap layer have up to 100 times reduction in the frequency of electromigration defects in the semiconductor devices in comparison to semiconductor devices having: [1] no cobalt seed layer and no cobalt cap layer, [2] no cobalt seed layer, or [3] no cobalt cap layer.

Method 100 includes an operation 116 wherein at least one etch stop layer is deposited over the conductive material of the first interconnect segment. According to some embodiments, the bottom etch stop layer deposited over the dielectric layer and the first interconnect segment includes an aluminum oxy-nitride or aluminum oxide layer. In some embodiments, a middle etch stop layer deposited over the dielectric layer and the first interconnect segment includes an oxygen doped carbon layer. In some embodiments, a top etch stop layer deposited over the dielectric layer and the first interconnect segment includes an aluminum oxide ($AlO_x$) layer. Semiconductor devices having at least one etch stop layer have more uniform openings for second and subsequent interconnect segments than semiconductor devices without etch stop layer. Etch stop layers protects materials and layers below the etch stop layer while etch processes are being performed above the etch stop layer.

According to some embodiments, etch stop layers as described above are deposited by chemical vapor deposition (CVD) or PVD processes. According to some embodiments, each of the etch stop layers deposited over the dielectric layer and the first interconnect segment has different degrees of resistance to plasma etch layers above the etch stop layer. According to some embodiments, multiple etching processes are performed above and each etch process stop on, or penetrate through, one of etch stop layers before exposing the first interconnect segment and/or dielectric layer. In a non-limiting embodiment, semiconductor device 200 in FIG. 2D includes the etch stop layer 216, etch stop layer 218, and etch stop layer 220 above dielectric layer 202 and interconnect segment 213.

Method 100 includes an operation 118 wherein a second dielectric layer is deposited over the at least one etch stop layer. According to some embodiments, the second dielectric layer is a silicon dioxide layer. According to some embodiments, the second dielectric layer is a low-k dielectric layer and is deposited in a manner similar to the manner described above in the description of operation 102. In some embodiments, the second dielectric layer is a porous dielectric layer. In some embodiments, the second dielectric layer is a solid material without holes or openings therein.

Method 100 includes an operation 120 wherein an opening is formed through the second dielectric layer. Forming an opening in a dielectric layer includes steps of depositing a layer of patterning material over the dielectric layer, transferring a pattern to the layer of patterning material, forming openings in the layer of patterning material to expose the dielectric layer, and performing an etch process to remove exposed portions of the dielectric layer at the bottom of the openings in the layer of patterning material. In a non-limiting example, semiconductor device 200 of FIG. 2E includes an opening 224 through dielectric layer 222. The opening 224 has been vertically extended through the entirety of dielectric layer 222, and through the etch stop layer 220 and the etch stop layer 218. Opening 224 extends partly into etch stop layer 216. Charge neutralization residue 225 is on a sidewall of the opening 224. Charge neutralization residue 225A is on a material at the bottom of the opening 224 (e.g., on the exposed surface of etch stop layer 216).

In some embodiments, the patterning material deposited over the dielectric layer includes photoresist or another material compatible with visible light lithography, ultraviolet light lithography (UV lithography, or UV patterning), electron beam lithography, and other methods of pattern transfer for semiconductor device manufacturing. In some embodiments, the patterning material is a visible-light compatible photoresist. In some embodiments, the patterning material is a UV lithography-compatible patterning material. In some embodiments, the patterning material is a mask material compatible with electron beam pattern transfer techniques. In some embodiments, the layer of patterning material is deposited over the dielectric layer by a spin-on technique and baking the spun-on material to cure the patterning material prior to developing.

In some embodiments, forming openings in the layer of patterning material includes developing the patterning material, where the develop process removes a portion of the layer of patterning material, and leaving behind a mask portion of the layer of patterning material. In some embodiments, the dielectric layer is below the layer of patterning material, and the dielectric layer is exposed within the openings. In some embodiments, a layer of hardmask material is between the layer of patterning material and the dielectric layer, and the layer of hardmask material is exposed at the bottom of the openings. In some embodiments, an etch process is performed to transfer the pattern directly to the dielectric layer. In some embodiments, a first etch process is performed to transfer the pattern to the layer of hardmask material, and a second etch process is performed to transfer the pattern is to dielectric layer. In some embodiments, multiple pattern transfer and etch steps are performed in order to form a dual-damascene type opening for an interconnect segment through the dielectric layer. In some embodiments, a first etch process forms trench openings in the dielectric layer, and a second etch process forms via openings aligned with the trench openings in the dielectric layer.

In some embodiments, forming an opening through the second dielectric layer includes wet processing steps to selectively remove one or more of the etch stop layers (e.g., after performing a plasma etch, performing a wet etch to remove the etch stop layer exposed by the plasma etch), to give a clean surface for subsequent operations of the manufacturing process of the semiconductor device.

In some embodiments, forming an opening through the second dielectric layer includes etching through the entirety of the second dielectric layer in an opening of the pattern over the second dielectric layer with the opening of the pattern offset from the position of the first interconnect segment below the second dielectric layer. By offsetting the opening through the second dielectric layer from the first interconnect segment [1] the second interconnect segment (to be formed in the opening through the second dielectric layer, see operation 130, below) makes contact with part of the top surface of the first interconnect segment, and [2] part of the sidewall of the first interconnect segment. In FIG. 3D, conductive material 328A extends through an entirety of the second dielectric layer, and the etch stop layers 316, 318, 320, and down into dielectric layer 302. Liner 326A separates interconnect segment 313 from conductive material 328A. The overlap between liner 326A and first interconnect segment provides for an interface area between the interconnect segment 313 and the interconnect segment 315C.

Method 100 includes an operation 122 wherein a charge neutralization process is performed on the semiconductor device. In a non-limiting embodiment, semiconductor device 200 of FIG. 2E has undergone a charge neutralization process as described below, and charge neutralization residue 225 remains on the sidewalls of opening 224, charge neutralization residue 225A is on a material at the bottom of the opening 224 (e.g., on the exposed surface of etch stop layer 216).

Charge builds up on semiconductor wafers during manufacturing processes. The charge buildup on a semiconductor wafer triggers pitting and galvanic corrosion of interconnect segments when the exposed metal of unmodified cap layers, or the bare interconnect segment, is exposed to moisture (water or other liquids capable of conducting an electric current).

The amount of charge buildup (e.g., the wafer electrical potential with respect to ground) changes during a semiconductor device manufacturing process, as the charge buildup is bled off (by, e.g., grounding the wafer) or added to during wafer handling. A charge neutralization process is a liquid treatment of the semiconductor wafer to remove or reduce the charge buildup without triggering pitting or galvanic corrosion of the exposed conductors (e.g., cap layers, interconnect segments, and so forth) during a manufacturing process. The liquid treatment for charge neutralization comprises [1] preparing a dilute solution of ionic solutes (a charge neutralization wash) which precipitate on exposure to the static electricity buildup on the semiconductor wafer, [2] applying the charge neutralization wash to the wafer or semiconductor device, and [3] rinsing the charge neutralization wash from the wafer or semiconductor device.

A charge neutralization wash includes ionic solutes which receive electrons from the wafer substrate to convert the dissolved ions into a suspended precipitate which is removed from the semiconductor device in a rinse step after charge neutralization. According to some embodiments, charge neutralization washes include a solution containing one or more of: $BF_3$, $CO_2$, $SO_3^{2-}$, $Cu^+$, $Ag^+$, $GaCl_3$, $CN^-$, $RS^-$, and CO, wherein $RS^-$ is a thiol compound and R is an aliphatic chain having a main chain length L of 1 to 12 carbon atoms.

According to some embodiments, charge neutralization washes leave a neutralization residue behind on the exposed sidewalls of the dielectric layer. Further discussion of the charge neutralization residues is presented below in the discussion of FIG. 2E.

In some embodiments, the charge neutralization wash is applied to the opening through the second dielectric layer (see dielectric layer 222 of FIG. 2E) with the first etch stop layer (see etch stop layer 216 of FIG. 2E) at least partially intact. In FIG. 2E, semiconductor device 200 has undergone a charge neutralization wash, with charge neutralization residues 225 on the sidewall of opening 224, and charge neutralization residue 225A on a bottom of the opening 224, on etch stop layer 216.

According to some embodiments, a charge neutralization wash has a pH of at least 8 and not more than 12. By maintaining the pH at not less than least 8 and not more than 12, the charge neutralization wash has a pH which [1] promotes removal of aluminum oxide (e.g., a common etch stop material, see etch stop layer 216 in FIG. 2E, below), and dissolve copper oxides. Unoxidized copper has a very low dissolution rate at pH at least 8 and not more than 12, the solution promotes cleaning of the dielectric layer, cap layer (if exposed), and interconnect segment (if exposed) while promoting the charge neutralizing function of the solution. A pH of less than 8 results in passivation of aluminum oxide surfaces, rather than removal or cleaning of aluminum oxide residues (or, etch stop layers), resulting in increased manufacturing cost and lengthened manufacturing times. A pH of more than 12 promotes copper corrosion and the formation of $CuO_2^{2-}$ ions during processing, causing, rather than decreasing, pitting and galvanic corrosion in the semiconductor device.

Charge neutralization wash is adjusted to the pH of at least 8 and not more than 12 by adding ammonium hydroxide ($NH_4OH$) to the solution. The semiconductor device is rinsed using a combination of ammonium hydroxide ($NH_4OH$) with hydrogen peroxide ($H_2O_2$), followed by a dilute solution of carbonic acid ($CO_2$ in water, or $H_2CO_3$) in Di water to neutralize residual ammonium hydroxide over the wafer surface after the charge neutralization. In some embodiments, charge neutralization is performed after every liquid etch/wet processing step to neutralize charge buildup on a wafer. Charge neutralization, as described hereinabove, is compatible with liquid etch manufacturing steps throughout the semiconductor device manufacturing flow and is effective at reducing voids (especially copper interconnect voids) at all layers of the semiconductor device interconnect structure. In some embodiments, oxygen-depleted (degassed, or oxygen-purged) deionized water containing a sodium sulfide solution is used as a rinsing agent in a charge neutralization process to remove charge buildup, to remove precipitate atoms, and to neutralize residual acid or peroxide on a wafer surface.

Performing charge neutralization of a semiconductor device is effective at reducing a charge buildup on a wafer from more than 3 Volts to less than 0.5 Volts after the charge neutralization wash. A charge neutralization wash is effective at reducing the charge buildup over an entire wafer, and is non-uniform across the wafer, to a lower, more uniform value. For example, in some embodiments, a charge buildup on a wafer is largest (e.g., most negative) at a center of a wafer, decreases gradually along a mid-radius portion of the wafer, and drops off sharply at a wafer perimeter. Performing a charge neutralization wash on a wafer reduces the charge buildup on the wafer to a lower, more uniform level across the entire mid-radius and center regions of the wafer, with a drop-off at the wafer perimeter.

Method 100 includes an operation 124, wherein a top surface the interconnect segment (see FIG. 2F, interconnect segment 213) is exposed. In FIG. 2F, etch stop layer 216 has been opened completely and the cap layer 212 is exposed at the bottom of opening 224. Charge neutralization residue 225A on etch stop layer 216 has been removed during the process of opening the etch stop layer 216 and exposing the cap layer 212. Charge neutralization residues 225 remain on sidewalls of opening 224.

In some embodiments, the top surface of the interconnect segment is exposed by performing a liquid etch process after performing the charge neutralization wash described above in operation 122. In some embodiments, both the charge neutralization wash (operation 122) and opening the etch stop layer to expose the interconnect segment (operation 124) are performed in a same wet etch processing tool, and the liquid stream applied to the surface of the wafer is switched smoothly between [1] charge neutralization wash, [2] rinse, and [3] etch chemistry to expose the underlying interconnect segment without removing the wafer from the processing tool. By reducing the processing time between performing the charge neutralization wash and etch to expose the interconnect segment, an amount of time for pitting and galvanic corrosion is reduced, further decreasing the likelihood of void formation in the semiconductor device during a manufacturing flow for the semiconductor device.

Method 100 includes an operation 126, wherein a liner is deposited in the opening through the second dielectric layer. In FIG. 2G, semiconductor device 200 has a liner 226 deposited over a sidewall of dielectric layer 222 in opening 224. In some embodiments, the liner material is deposited by plasma vapor deposition (PVD). In some embodiments, the PVD process is a sputtering process. In some embodiments, the PVD process is an evaporation process. In some embodiments, the liner material comprises tantalum nitride (TaN), titanium nitride (TiN), niobium nitride (NbN), or another metal nitride which slows or blocks diffusion of interconnect segment metal (e.g., copper, aluminum, and so forth) into dielectric layers of a semiconductor device. In some embodiments, the liner is deposited on both the sidewalls of the opening through the second dielectric layer, and on the surface of the cap layer (or, modified cap layer) exposed at the bottom of the opening through the second dielectric layer.

Method 100 includes an optional operation 128, wherein a seed layer is deposited in the opening through the second dielectric layer. A seed layer is deposited over the liner in order to promote a smooth growth or deposition pattern of the layer of conductive material deposited for the interconnect segment formed in the opening through the dielectric layer. In some embodiments, a seed layer is a pure metal. In some embodiments, the seed layer is a metal alloy. In some embodiments, the seed layer comprises cobalt, tantalum, titanium, nickel, niobium, copper, or another seed layer metal compatible with copper deposition in the opening through the dielectric layer. According to some embodiments, the thickness of the seed layer is different on sidewalls of the opening that over the bottom of the opening. According to some embodiments, thickness of the seed layer on a sidewall ranges from about 5 Ångstroms (Å) to about 50 Å. In some embodiments, thickness of the seed layer is about 20 Å. A thickness of a seed layer less than 5 Å (or, an average thickness of less than 5 Å) is likely to have incomplete coverage of the liner, where the liner will make electrical contact with conductive material of an interconnect segment after the opening is filled. A thickness of the seed layer greater than 50 Å does not produce additional benefits to a semiconductor device, and merely prolongs manufacturing time and increases manufacturing costs.

Method 100 includes an operation 130, wherein a second interconnect segment is formed in the opening in the second dielectric layer. A second interconnect segment is formed in a manner similar to the formation of the first interconnect segment, as described in operation 110, above. Forming a second interconnect segment includes steps related to adding a conductive material to an opening through a dielectric layer. In some embodiments, adding a conductive material to an opening through a dielectric layer includes electroplating. In some embodiments, adding a conductive material to an opening includes performing a sputtering process in some embodiments, adding a conductive material includes performing a PVD process (a sublimation or evaporation-type process). In some embodiments, the conductive material is a pure metal. In some embodiments, the conductive material is a metal alloy. In some embodiments, the conductive material deposited in the opening to form the second interconnect segment comprises copper, aluminum, tungsten, or alloys thereof. According to some embodiments, the conductive material for the interconnect segment is deposited both in the opening through the dielectric layer, and over a top surface of the dielectric layer. Subsequent to deposition of the conductive material, a chemical-mechanical polishing (CMP) step is performed to remove conductive material from the top surface of the dielectric layer, leaving behind a portion of conductive material in the opening (now filled) through the dielectric layer. Thus, after performing a CMP step, interconnect segments embedded in the dielectric layer are electrically isolated from each other and have exposed top surfaces.

FIGS. 2A-2G are cross-sectional diagrams of a semiconductor device 200, in accordance with some embodiments. FIGS. 2A-2G are representative of cross sectional diagrams taken during a manufacturing flow. In FIGS. 2A-2G, elements of the semiconductor device 200 which have a same structure and function have a same identifying numeral. It is recognized that other embodiments of semiconductor devices different from semiconductor device 200 are also within the scope of the present disclosure. Some alternative embodiments are presented below in the discussion of FIGS. 3A-3D, according to variations of the manufacturing flow described in method 100, above. In FIGS. 3A-3D, elements of the semiconductor devices which have a same structure and function have a same identifying numeral as the semiconductor device 200, incremented by 100. Variations of an element of a semiconductor device are indicated by the addition of a trailing letter in addition to incrementing the identifying numeral by 100.

In FIG. 2A, a dielectric layer 202 of semiconductor device 200 is deposited over a semiconductor base 201, with an opening 204 extending through the dielectric layer 202. A sidewall 204A (or, sidewalls) of the dielectric layer 202, or of the opening 204, extend from semiconductor base 201 to the top of dielectric layer 202. In method 100, the dielectric layer is deposited over the semiconductor base layer in operation 102. In method 100, an opening is formed through the dielectric layer in operation 104.

In some embodiments, the dielectric layer is a low-k dielectric material, with a dielectric constant of less than 3.9. In some embodiments, the dielectric layer is a porous low-k material. In some embodiments, the low-k dielectric material is a solid dielectric layer, with no voids.

In FIG. 2B, a liner 206 of semiconductor device 200 is deposited over semiconductor base 201 (e.g., on the top surface of semiconductor base 201), and on sidewalls 204A. A seed layer 208 is deposited over the liner 206. In method 100, a liner is deposited on sidewalls 204A and the semiconductor base 201 in operation 106. In method 100, a seed layer is deposited in operation 108.

In some embodiments, the liner comprises a metal nitride. According to some embodiments, the liner comprises tantalum nitride (TaN), titanium nitride (TiN), niobium nitride (NbN), or another metal nitride which slows or blocks metal diffusion into a dielectric layer. Other liner materials which slow or block metal diffusion into a dielectric layer are also within the scope of the present disclosure.

In some embodiments, the liner material comprises tantalum nitride (TaN), titanium nitride (TiN), niobium nitride (NbN), or another metal nitride which slows or blocks diffusion of interconnect segment metal (e.g., copper, aluminum, and so forth) into dielectric layers of a semiconductor device.

In some embodiments, the seed layer is a pure metal. In some embodiments, the seed layer is a metal alloy. According to some embodiments, the seed layer comprises cobalt, tantalum, titanium, nickel, niobium, copper, or another seed layer metal compatible with deposition of a conductive material the opening of the dielectric layer. Seed layer 208 has a non-uniform thickness, with a smaller thickness on the sidewalls, and a larger thickness on the bottom of the opening through the dielectric layer. According to some embodiments, thickness of the seed layer on a sidewall ranges from about 5 Angstroms (Å) to about 50 Å. In some embodiments, thickness of the seed layer is about 20 Å. A thickness of a seed layer less than 5 Å (or, an average thickness of less than 5 Å) is likely to have incomplete coverage of the liner, where the liner will make electrical contact with conductive material of an interconnect segment after the opening is filled. A thickness of the seed layer greater than 50 Å does not produce additional benefits to a semiconductor device, and merely prolongs manufacturing time and increases manufacturing costs.

In FIG. 2C, conductive material 210 has been deposited into opening 204 over seed layer 208, and a cap layer 212 is over the top surface of the conductive material 210. Cap layer 212 is a modified cap layer comprising an organometallic film of cobalt, carbon, and nitrogen. Interconnect segment 213 extends through dielectric layer 202 down to semiconductor base 201. In method 100, conductive material is added to an opening for an interconnect segment in operation 110. In method 100, a cap layer is deposited over the conductive material in operation 112. In method 100, the cap layer is modified to have an organometallic layer in operation 114.

Conductive material 210 is copper. In some embodiments, the conductive material is a copper alloy, or a tungsten alloy, or some other material suitable for filling trench structures in a dielectric layer. According to some embodiments, the copper for conductive material 210 is deposited by electroplated, and thinned off of the top surface of dielectric layer 202 by a chemical mechanical polishing (CMP) step.

Cap layer 212 comprises a same material as seed layer 208. In some embodiments, the cap layer includes a different metal than the seed layer. In some embodiments, the cap layer is a cobalt cap layer, and the seed layer is a cobalt seed layer. In some embodiments, the thickness of the cap layer ranges from 10 Å to 80 Å. Cap layer thicknesses of less than 10 Å are subject to increased frequency of pitting and erosion. Cap layers larger than 80 Å are unnecessarily thick and result in increased manufacturing cost and decreased productivity of a manufacturing process.

Cap layer 212 is modified to have an organometallic film thereon by steps described above in operation 114. The organometallic cobalt/carbon/nitrogen coating at the top surface of the cap layer is understood to be moderately hydrophobic, repelling water and other liquids from the top surface by, e.g., preventing "wetting" of the surface due to an increased contact angle of the organometallic film on the cap layer, to reduce liquid intrusion into the cap layer and down to the conductive material. According to some embodiments, the addition of methyl radicals to ammonia/cobalt van der Waals complexes produces C—N bonds, C—Co bonds, and N—Co bonds. In some embodiments, the addition of methyl radicals to the Co—NH$_3$ van der Walls complexes produces Co—CN complexes on the top surface of the cobalt cap layer.

Figure 2D:
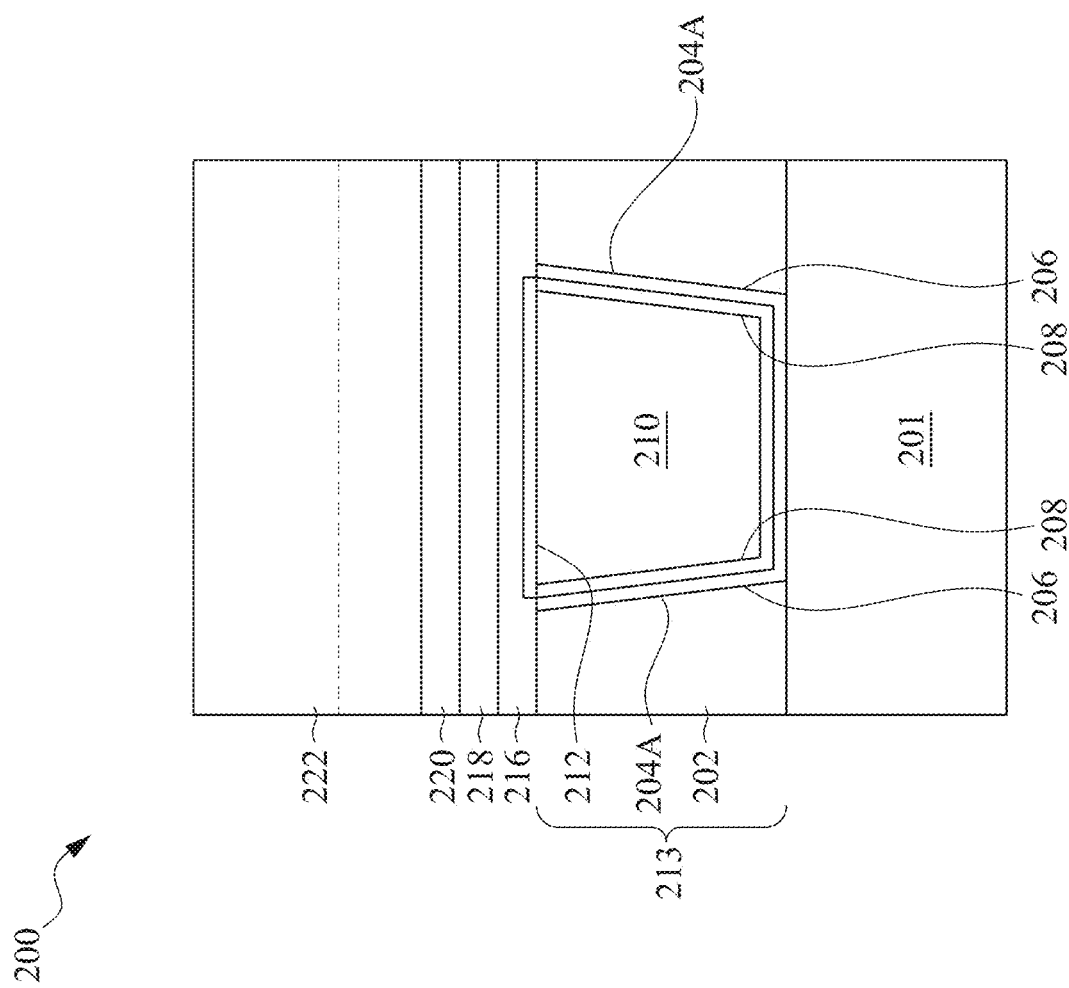
Figure 2F:
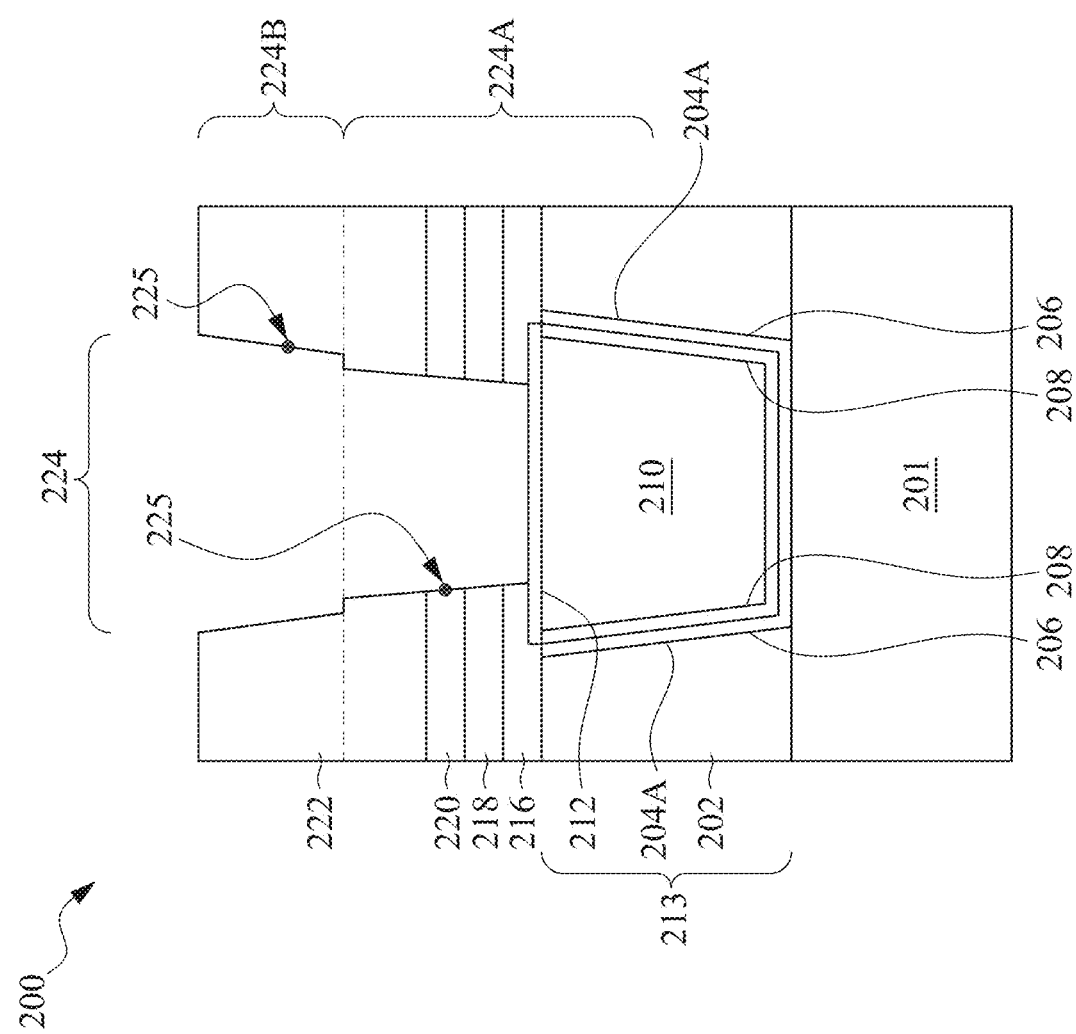
Figure 2G:
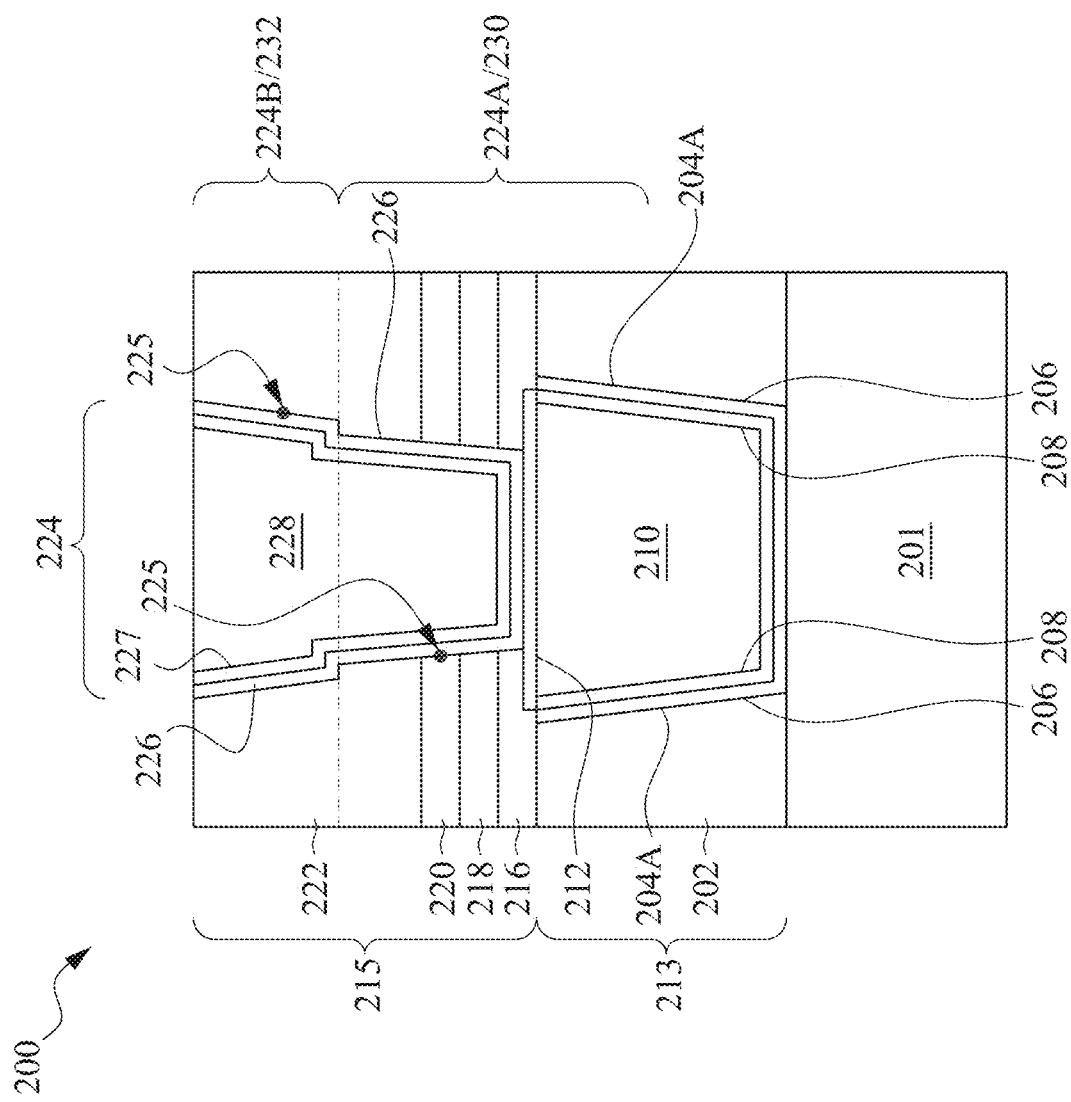

In FIG. 2D, etch stop layers 216, 218, and 220 are deposited over first interconnect segment 213 and dielectric layer 202. Dielectric layer 222 is deposited over etch stop layer 220. In method 100, etch stop layers 216, 218, and 220 are deposited in operation 116. In method 100, a dielectric layer 222 is deposited in operation 118.

Etch stop layers 216, 218, and 220 are deposited by, e.g., a PVD process. According to some embodiments, etch stop layer 216 is an aluminum oxy-nitride (AlON) layer or an aluminum oxide (Al$_2$O$_3$) layer. According to some embodiments, etch stop layer 218 is an oxide-doped carbon layer (e.g., silicon carbide with oxygen inclusions). According to some embodiments etch stop layer 220 is an aluminum oxide layer (Al$_2$O$_3$ or AlO$_x$). Etch stop layers 216, 218, and 220 are configured to provide different selectivity to plasma and liquid etch chemistries during the manufacturing process of semiconductor device 200.

In some embodiments, dielectric layer 222 is a silicon dioxide layer deposited by a CVD process. In some embodiments, dielectric layer 222 is a low-k dielectric material deposited by, e.g., a spin-on coat process, followed by a bake process to drive off solvent in the spin-on material and harden or polymerize the low-k dielectric material precursor into a solid form.

In FIG. 2E, opening 224 has been formed by one or more etch processes (e.g., plasma etch processes with a high degree of anisotropy). In method 100, an opening is formed through a second dielectric layer in operation 120. In method 100, a charge neutralization residue is produced on the sidewalls of an opening in a dielectric layer in an operation 122.

In some embodiments, the etch processes are plasma etch processes configured to have straight sidewalls. Opening 224 extends through dielectric layer 222, etch stop layer 220, etch stop layer 218, and partly into etch stop layer 216.

A remaining portion of etch stop layer 216 separates opening 224 from cap layer 212. A trench opening 224B is at an upper portion of the opening 224, and a via opening 224A is at a lower portion of the opening 224. In some embodiments, two plasma etch processes are used to form trench opening 224B and via opening 224A. In some embodiments, a single plasma etch process is used to form both trench opening 224B and via opening 224A.

Charge neutralization residues 225 are on a sidewall of opening 224, including on both trench opening 224B and via opening 224A. Charge neutralization residue 225A is on etch stop layer 216 at the bottom of via opening 224A. In some embodiments, the charge neutralization residue includes one or more of silver (Ag), carbon (C), gallium (Ga), boron (B), and fluorine (F) at a concentration of about $5\times10^{16}$ atoms/cm$^3$. A concentration of the neutralization residue ranges from about $1\times10^{16}$ atoms/cm$^3$ to about $1\times10^{17}$ atoms/cm$^3$. A neutralization residue concentration of less than about $1\times10^{16}$ atoms/cm$^3$ is indicative of insufficient exposure of the semiconductor device, or the interconnect segment, to the charge neutralizing chemicals in the charge neutralization wash, leaving static electricity buildup on the semiconductor device and promoting corrosion of the interconnect segment (e.g., the cap layer, the liner, and/or the conductive material filled into the opening in the dielectric layer). A neutralization residue concentration of greater than about $1\times10^{17}$ atoms/cm$^3$ is indicative of overexposure of the semiconductor device, or the interconnect segment, or the cap layer (modified or unmodified) to the charge neutralizing chemicals, with an elevated likelihood of charge neutralization residues contaminating the opening for the interconnect segment, or contaminating the dielectric layer before a new liner (or new seed layer) is deposited in the opening through the second dielectric layer.

In FIG. 2F, opening 224 has been extended down to cap layer 212 of interconnect segment 213. In method 100, extending the opening down to a cap layer or the interconnect segment is performed in operation 122, or in operation 124. According to some embodiments of operation 122, the charge neutralization solution, and the rinse solution for treatment of the wafer or semiconductor device after charge neutralization, are basic solutions with a pH of not less than 8 and not more than 12. The etch stop layer 216 is an aluminum oxide, which is soluble in strong basic solutions. Thus, by extending exposure of the charge neutralization solution and the rinse solution on the semiconductor device, the charge neutralization process is able to complete the process of etching down to the cap layer or interconnect segment. In some embodiments, the process of continuing the opening 224 down to cap layer 212 is performed in a separate etch stop using a plasma etch or a liquid/wet etch. Charge neutralization residue 225A is removed from the opening along with the removal of the exposed portion of etch stop layer 216 at the bottom of the opening, and over cap layer 212.

In FIG. 2G, liner 226 is deposited over sidewalls of opening 224, and on the top surface of cap layer 212. Seed layer 227 is deposited over liner 226 within opening 224. Conductive material 228 is deposited over liner 226 and seed layer 227 to fill opening 224, forming interconnect segment 215 from the top surface of cap layer 212 to the top of dielectric layer 222. Thus, via opening 224A and trench opening 224B are filled with conductive material 228. The top surface of conductive material 228 is approximately at a same height above etch stop layer 220 as the top of dielectric layer 222. Interconnect segment 215 is aligned with interconnect segment 213.

In method 100, a liner is deposited into the opening through the second dielectric layer in operation 126. In method 100, a description of depositing a seed layer over the liner is provided in operation 128. In method 100, a description of depositing conductive material over the seed layer is provided in operation 130.

Liner 226 is a tantalum nitride layer. In some embodiments, other liner materials such as titanium nitride (TiN), niobium nitride (NbN), or another metal nitride which slows or block metal diffusion in to a dielectric layer are used instead of tantalum nitride. Seed layer 227 is a cobalt seed layer. In some embodiments, other metals are used for the seed layer, according to the discussion of operation 108, above.

Conductive material 228 is copper metal. In some embodiments, a copper alloy is used for filling the opening and forming interconnect segments through the dielectric layer 222. Further discussion of conductive materials suitable for deposition into an opening through a dielectric layer is provided above in the discussion of operation 110.

Charge neutralization residues 225 are embedded between dielectric layer 222 and liner 226. In some embodiments, the charge neutralization residue includes one or more of silver (Ag), carbon (C), gallium (Ga), boron (B), and fluorine (F) at a concentration of about $5\times10^{16}$ atoms/cm$^3$. A concentration of the neutralization residue ranges from about $1\times10^{16}$ atoms/cm$^3$ to about $1\times10^{17}$ atoms/cm$^3$. A neutralization residue concentration of less than about $1\times10^{16}$ atoms/cm$^3$ is indicative of insufficient exposure of the semiconductor device, or the interconnect segment, to the charge neutralizing chemicals in the charge neutralization wash, leaving static electricity buildup on the semiconductor device and promoting corrosion of the interconnect segment (e.g., the cap layer, the liner, and/or the conductive material filled into the opening in the dielectric layer). A neutralization residue concentration of greater than about $1\times10^{17}$ atoms/cm$^3$ is indicative of overexposure of the semiconductor device, or the interconnect segment, or the cap layer (modified or unmodified) to the charge neutralizing chemicals, with an elevated likelihood of charge neutralization residues contaminating the opening for the interconnect segment, or contaminating the dielectric layer before a new liner (or new seed layer) is deposited in the opening through the second dielectric layer.

Interconnect segment 213 and interconnect segment 215 are non-overlapping interconnect segments, where the interconnect segments meet at an interface which corresponds to an interface between a dielectric layer and an etch stop layer. Interconnect segment 215 includes contact 230 and conductive line 232.

Figure 3A:
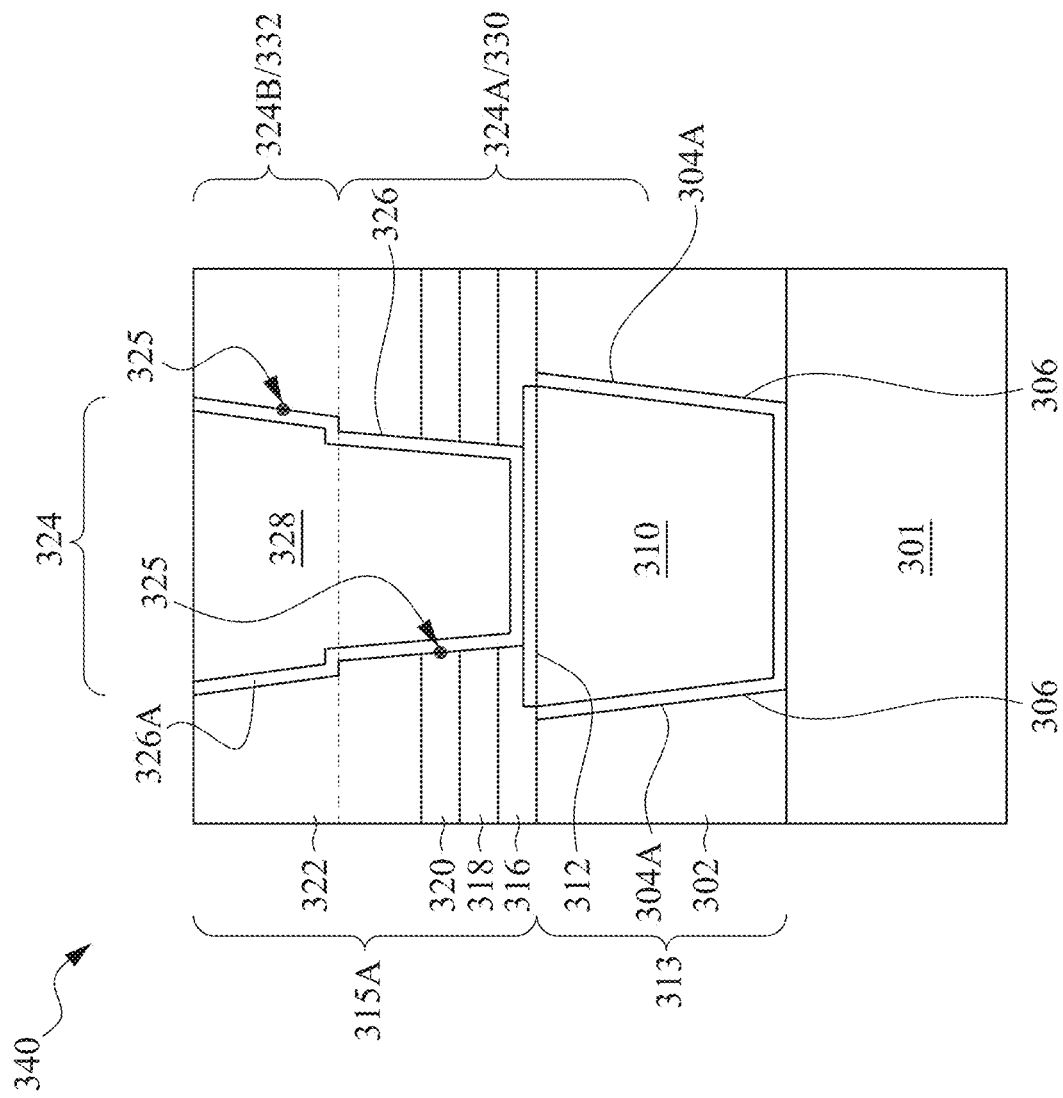
FIGS. 3A-3D are cross-sectional diagrams of a semiconductor device, in accordance with some embodiments.

In FIG. 3A, elements of semiconductor device 340 which have a same structure and function as elements of semiconductor device 200 have a same identifying numeral, incremented by 100. Interconnect segment 313 is similar in structure and position with regard to first dielectric layer, except that interconnect segment 313 lacks a seed layer (see FIG. 2G, seed layer 208) and liner 306 is in direct contact with conductive material 310 on sidewall 304A. Interconnect segment 315A is similar in structure and position with regard to dielectric layer 322 and interconnect segment 313, except that interconnect segment 315A lacks a seed layer and liner 326 is in direct contact with conductive material 328. Interconnect segment 315A includes a via 330 and a trench 332. Via 330 is in lower opening 324A, and trench 332 is in upper opening 324B. Semiconductor device 340 includes a cap layer 312 which is modified to have reduced pitting and protect conductive material 310 from galvanic corrosion. Semiconductor device 340 has charge neutralization residues 325 on sides of dielectric layer 322 and the between the liner 326 and etch stop layers 316, 318, and 320.

Figure 3B:
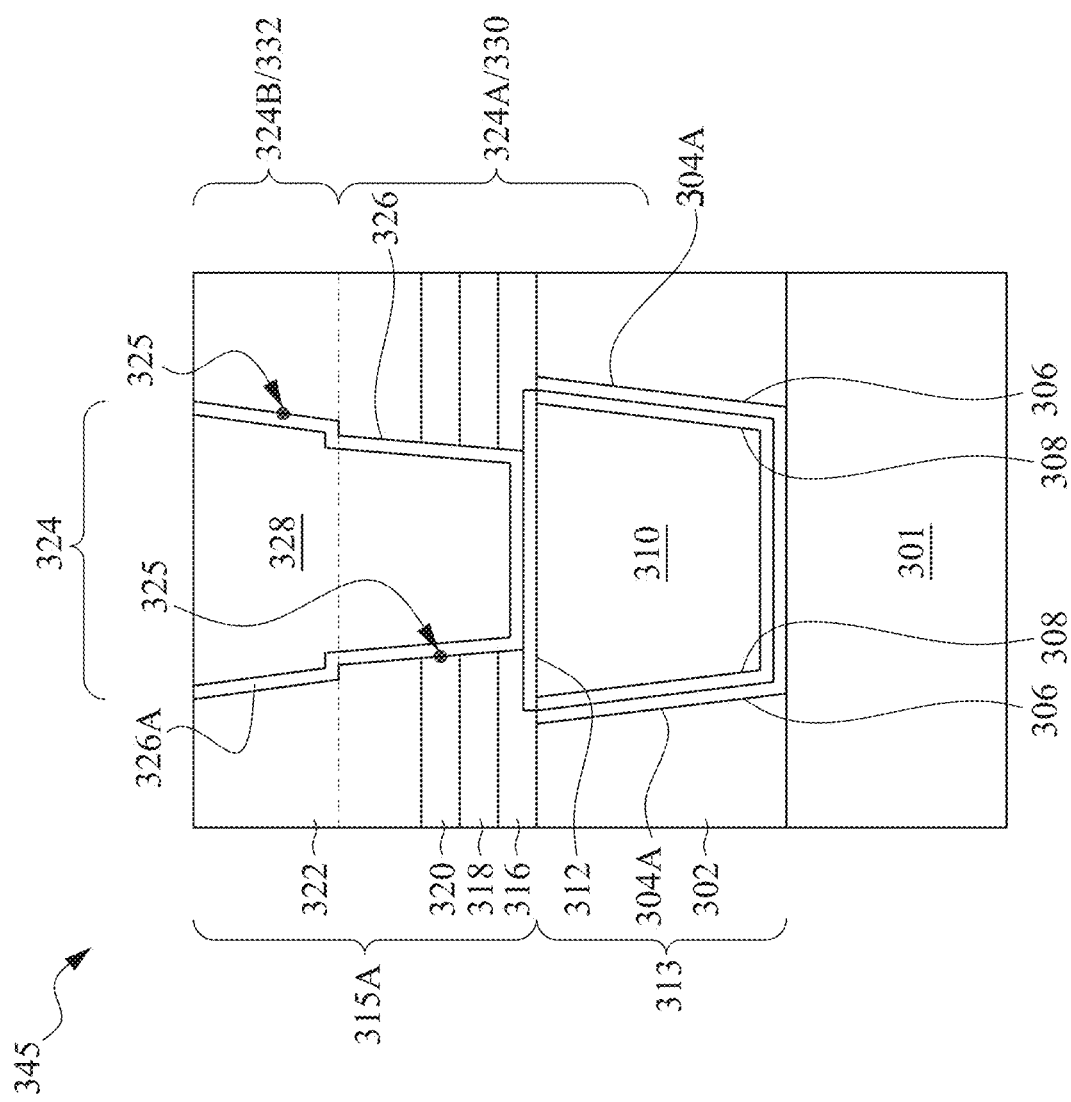

In FIG. 3B, elements of semiconductor device 345 which have a same structure and function as elements of semiconductor device 340 have a same identifying numeral. In interconnect segment 313, liner 306 is separated from conductive material 310 by seed layer 308.

In interconnect segment 315A, liner 326 is in direct contact with conductive material 328. Semiconductor device 345 includes a cap layer 312 which is modified to have reduced pitting and protect conductive material 310 from galvanic corrosion. Semiconductor device 345 has charge neutralization residues 325 on sides of dielectric layer 322 and the between the liner 326 and etch stop layers 316, 318, and 320. Interconnect segment 315A includes a via 330 and a trench 332. Via 330 is in lower opening 324A, and trench 332 is in upper opening 324B.

Figure 3C:
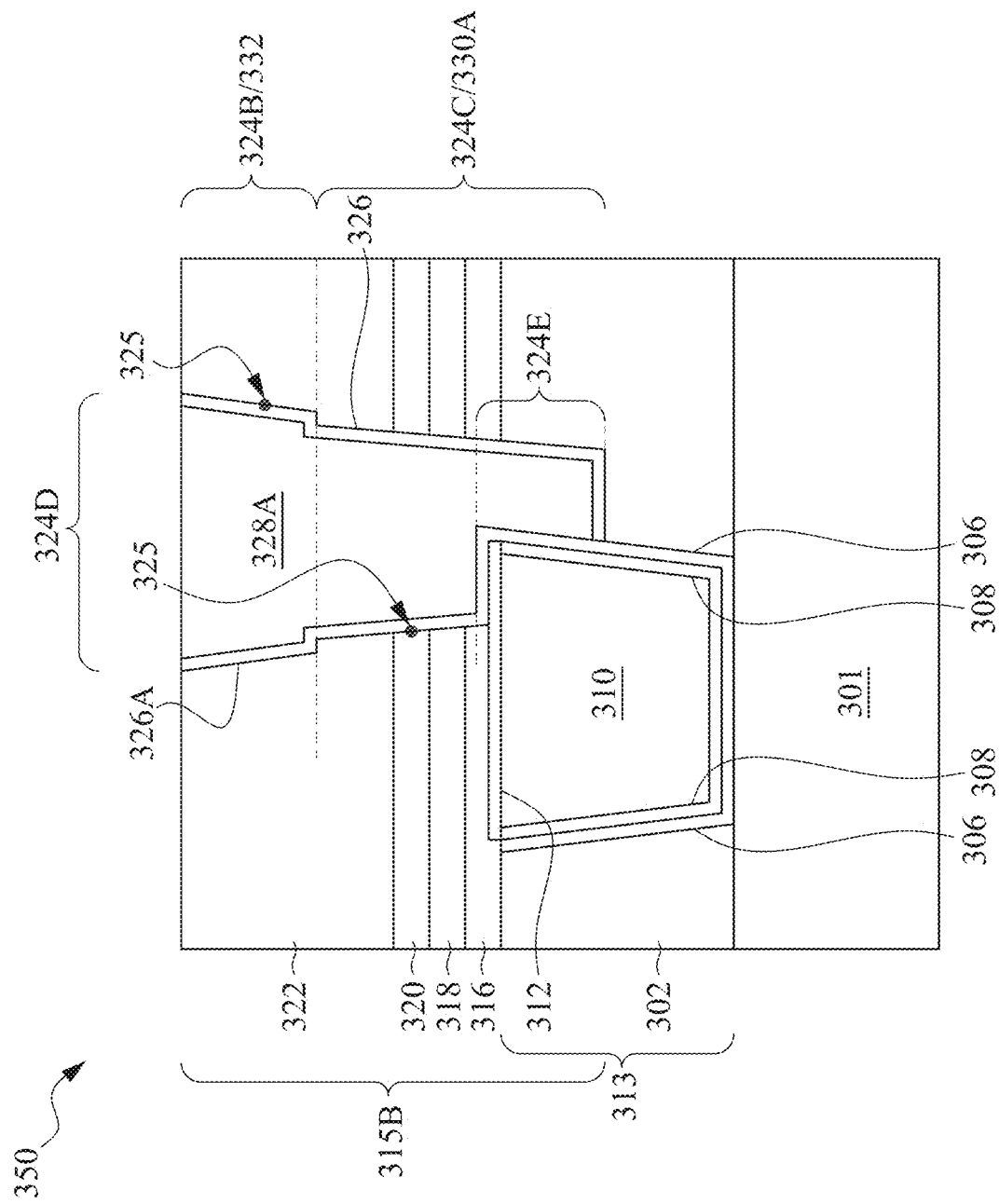
Figure 3D:
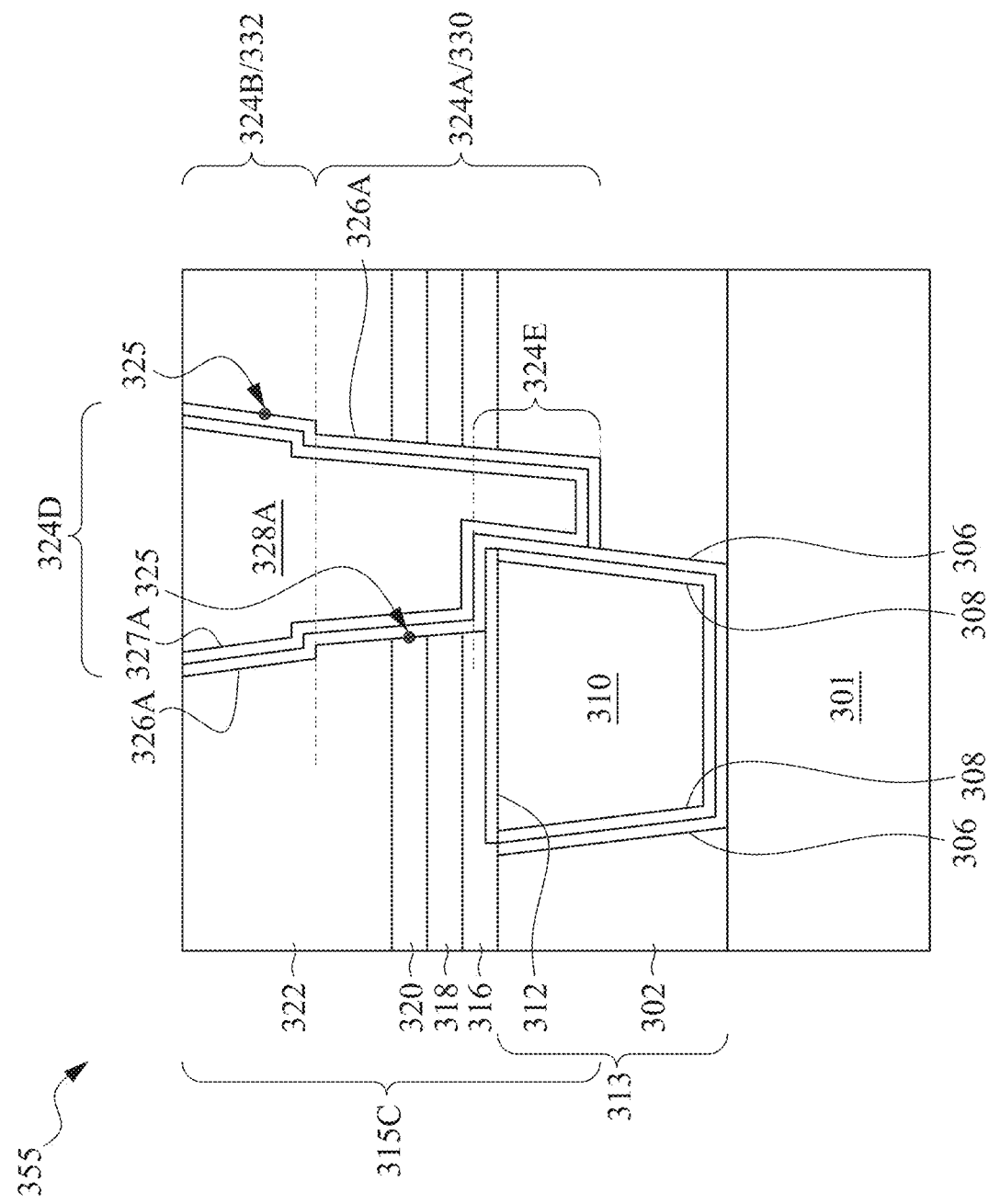

In FIG. 3C, elements of semiconductor device 350 which have a same structure and function as elements of semiconductor device 340 have a same identifying numeral. Interconnect segment 315B has charge neutralization residue 325 directly between liner 326A and dielectric layer 322. Interconnect segment 315B is an offset interconnect segment, where the centerline of the interconnect segment 313 and the centerline of the interconnect segment 315B are laterally offset from each other, and the interconnect segment 315B extends below the etch stop layer 316 down into dielectric layer 302. Interconnect segment 315B in opening 324D includes conductive line 332 in upper opening 324B and via 330A in lower opening 324C. A liner 326A extends around and below an end of cap layer 312, and along liner 306. A lower portion 324E of via 330A is a portion where no charge neutralization residues are located because the lower portion 324E was masked prior to etching the lower portion of the opening 324C. In some embodiments, the lower portion 324E also has charge neutralization residues, because the charge neutralization wash is applied to the surface of opening 324D after dielectric layer 302 is exposed by the etch which forms opening 324D.

In FIG. 3D, elements of semiconductor device 355 which have a same structure and function as elements of semiconductor device 350 have a same identifying numeral. Interconnect segment 315C has a seed layer 327A which extends between liner 326A and conductive material 328A. Seed layer 327A is physically isolates conductive material 328A from liner 326A, just as seed layer 308 physically isolates conductive material 310 from liner 306. Interconnect segment 315C is an offset interconnect segment, where the conductive material 328A, the liner 326A, and the seed layer 327A extend below a top surface of dielectric layer 302, along cap layer 312, and along a sidewall of interconnect segment 313.

Figure 4:
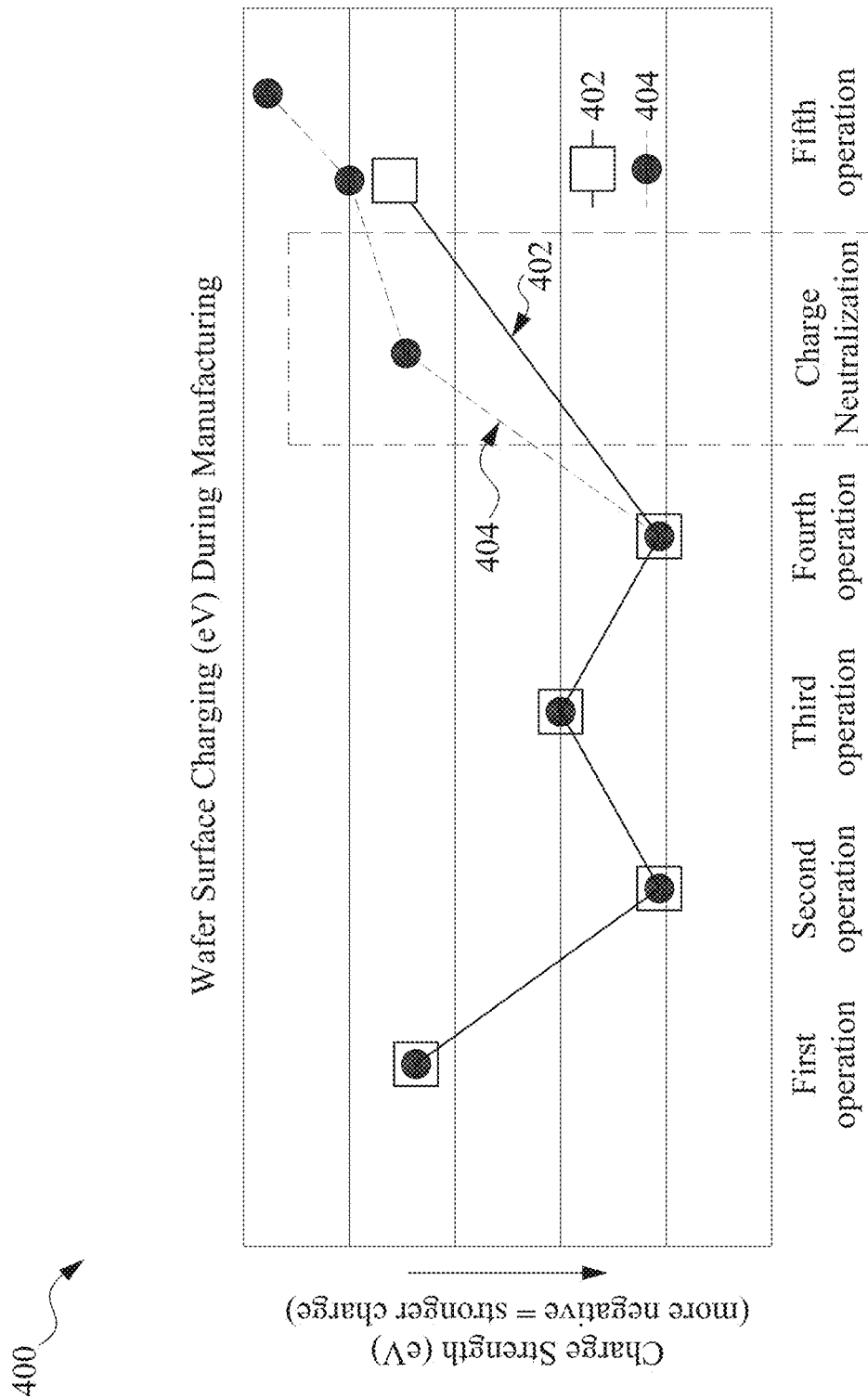
FIG. 4 is a graph of wafer charge buildup at steps of a manufacturing process, in accordance with some embodiments.

FIG. 4 is a graph 400 of wafer charge buildup at steps of a manufacturing process, in accordance with some embodiments. Graph 400 includes charge strength measurements for a wafer during a manufacturing process of a semiconductor device, similar to method 100, discussed above. Since electrons have a negative charge, a charge strength that is more negative, i.e., lower on the Y-axis of the graph 400, indicates a greater magnitude of the charge strength. A first set 402 (solid line) of charge values corresponds to a set of measurements of wafer charge during a manufacturing flow with no charge neutralization wash performed according to method 100 operation 122, described above. A second set 404 (dashed line) of charge values corresponds to a set of measurements of wafer charge during a manufacturing flow before and after a charge neutralization wash performed according to method 100 operation 122, described above. The second set 404 includes the charge values when the charge neutralization is performed between the fourth and fifth operations. The first set 402 includes the charges values without the charge neutralization process. Charge measurements are measured for a manufacturing flow after a first operation, a second operation, a third operation, a fourth operation, and a fifth operation. Charge measurements for the first set 402 and the second set 404 of measurements are similar through the first operation, the second operation, the third operation, and the fourth operation. A charge measurement after the fifth operation is different for the first set 402 and the second set 404 of measurements. The magnitude of the measured wafer charge is smaller (e.g., more positive) for the second set 404 of measurements after charge neutralization is performed, as compared to the first set 402 of measurements. By reducing the wafer charge after charge neutralization, the amount of time that a strong charge is on a wafer is reduced, reducing the amount of pitting and galvanic corrosion that a wafer develops during the manufacturing flow.

The method and embodiments described above are adjusted using an EDA system to compensate for the effect of charge neutralization on the wafer and seed layer deposition and offset of some interconnect segments (or, openings for the patterning and etch process described above). Variations of the embodiments and method described above, and in the EDA system instructions and the manufacturing flow described below, will be familiar to those having skill in the art.

Figure 5:
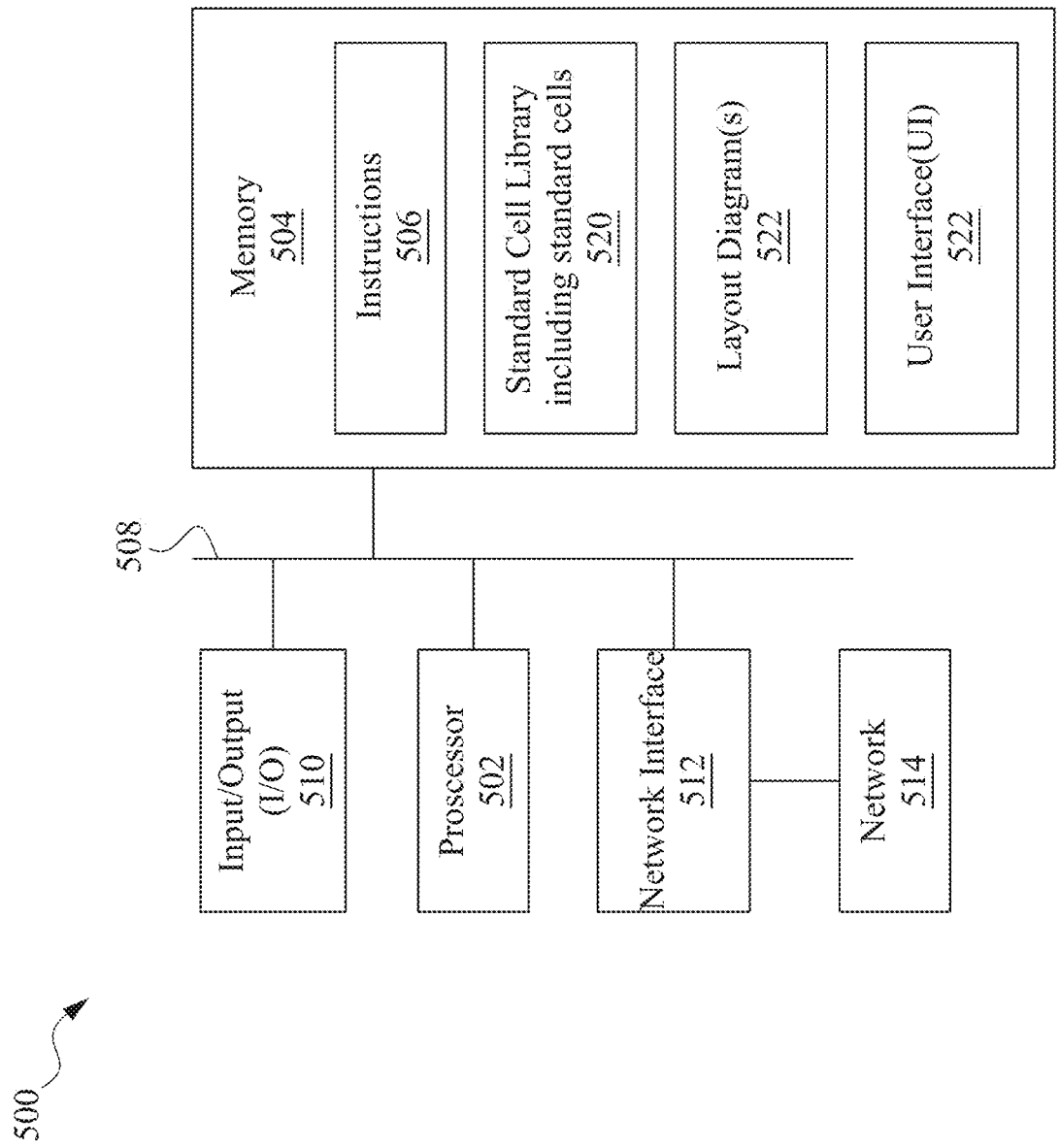
FIG. 5 is a block diagram of an electronic design automation (EDA) system, in accordance with some embodiments.

FIG. 5 is a block diagram of an electronic design automation (EDA) system 500 in accordance with some embodiments.

In some embodiments, EDA system 500 includes an APR system. Methods described herein of designing layout diagrams represent wire routing arrangements, in accordance with one or more embodiments, are implementable, for example, using EDA system 500, in accordance with some embodiments.

In some embodiments, EDA system 500 is a general purpose computing device including a hardware processor 502 and a non-transitory, computer-readable storage medium 504. Storage medium 504, amongst other things, is encoded with, i.e., stores, computer program code 506, i.e., a set of executable instructions. Execution of instructions 506 by hardware processor 502 represents (at least in part) an EDA tool which implements a portion or all of the methods described herein in accordance with one or more embodiments (hereinafter, the noted processes and/or methods).

Processor 502 is electrically coupled to computer-readable storage medium 504 via a bus 508. Processor 502 is also electrically coupled to an I/O interface 510 by bus 508. A network interface 512 is also electrically connected to processor 502 via bus 508. Network interface 512 is connected to a network 514, so that processor 502 and computer-readable storage medium 504 are capable of connecting to external elements via network 514. Processor 502 is configured to execute computer program code 506 encoded in computer-readable storage medium 504 in order to cause system 500 to be usable for performing a portion or all of the noted processes and/or methods. In one or more embodiments, processor 502 is a central processing unit (CPU), a multi-processor, a distributed processing system, an application specific integrated circuit (ASIC), and/or a suitable processing unit.

In one or more embodiments, computer-readable storage medium 504 is an electronic, magnetic, optical, electromagnetic, infrared, and/or a semiconductor system (or apparatus or device). For example, computer-readable storage medium 504 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 504 includes a compact disk-read only memory (CD-ROM), a compact disk-read/write (CD-R/W), and/or a digital video disc (DVD).

In one or more embodiments, storage medium 504 stores computer program code 506 configured to cause system 500 (where such execution represents (at least in part) the EDA tool) to be usable for performing a portion or all of the noted processes and/or methods. In one or more embodiments, storage medium 504 also stores information which facilitates performing a portion or all of the noted processes and/or methods. In one or more embodiments, storage medium 504 stores library 507 of standard cells including such standard cells as disclosed herein. In one or more embodiments, storage medium 504 stores one or more layout diagrams 509 corresponding to one or more layouts disclosed herein.

EDA system 500 includes I/O interface 510. I/O interface 510 is coupled to external circuitry. In one or more embodiments, I/O interface 510 includes a keyboard, keypad, mouse, trackball, trackpad, touchscreen, and/or cursor direction keys for communicating information and commands to processor 502.

EDA system 500 also includes network interface 512 coupled to processor 502. Network interface 512 allows system 500 to communicate with network 514, to which one or more other computer systems are connected. Network interface 512 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 500.

System 500 is configured to receive information through I/O interface 510. The information received through I/O interface 510 includes one or more of instructions, data, design rules, libraries of standard cells, and/or other parameters for processing by processor 502. The information is transferred to processor 502 via bus 508. EDA system 500 is configured to receive information related to a UI through I/O interface 510. The information is stored in computer-readable medium 504 as user interface (UI) 542.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 500. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 6:
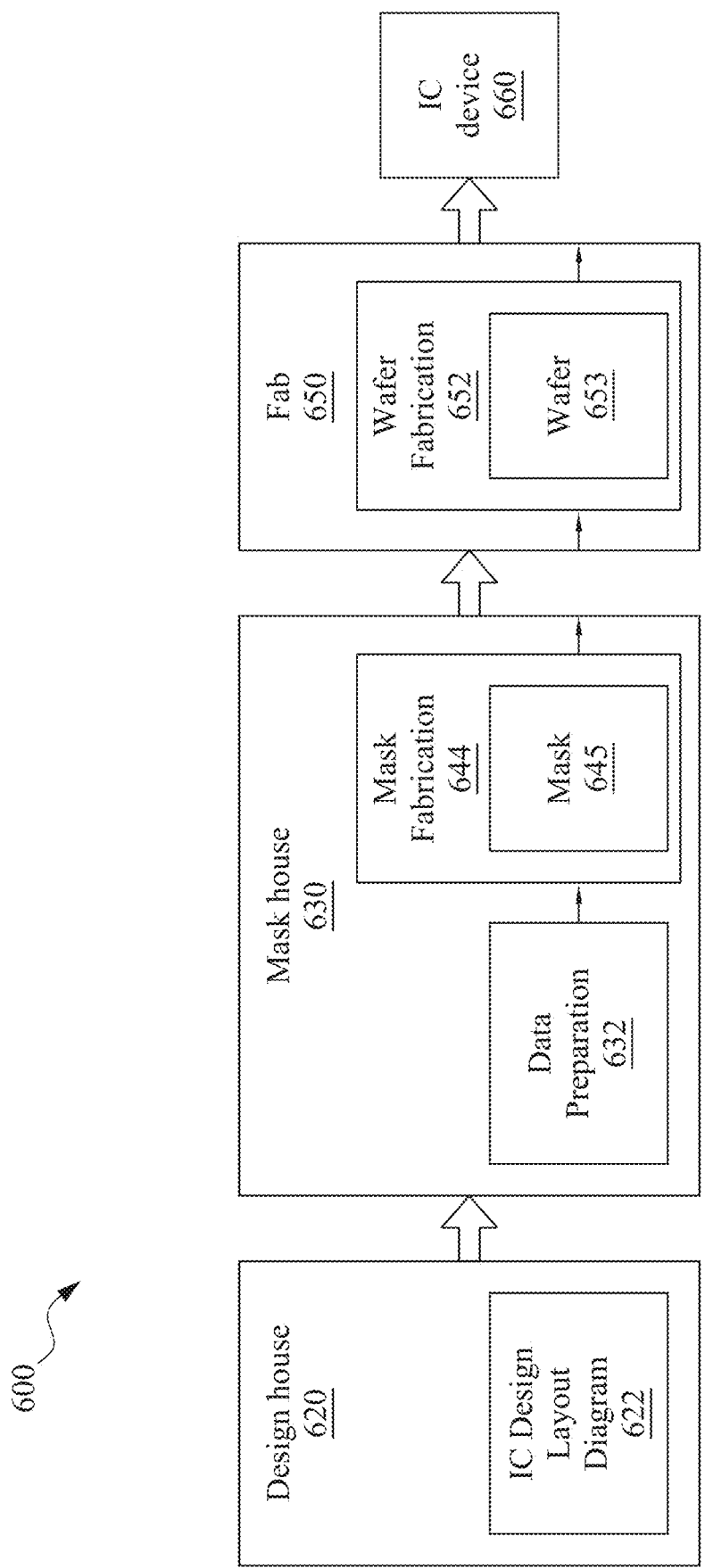
FIG. 6 is a block diagram of an integrated circuit (IC) manufacturing system, and an IC manufacturing flow associated therewith, in accordance with some embodiments.

FIG. 6 is a block diagram of an integrated circuit (IC) manufacturing system 600, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 600.

In FIG. 6, IC manufacturing system 600 includes entities, such as a design house 620, a mask house 630, and an IC manufacturer/fabricator ("fab") 650, that interact with one another in the design, development, and manufacturing cycles and/or services related to manufacturing an IC device 660. The entities in system 600 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 620, mask house 630, and IC fab 650 is owned by a single larger company. In some embodiments, two or more of design house 620, mask house 630, and IC fab 650 coexist in a common facility and use common resources.

Design house (or design team) 620 generates an IC design layout diagram 622. IC design layout diagram 622 includes various geometrical patterns designed for an IC device 660. The geometrical patterns correspond to patterns of metal, oxide, or semiconductor layers that make up the various components of IC device 660 to be fabricated. The various layers combine to form various IC features. For example, a portion of IC design layout diagram 622 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 620 implements a proper design procedure to form IC design layout diagram 622. The design procedure includes one or more of logic design, physical design or place and route. IC design layout diagram 622 is presented in one or more data files having information of the geometrical patterns. For example, IC design layout diagram 622 can be expressed in a GDSII file format or DFII file format.

Mask house 630 includes data preparation 632 and mask fabrication 644. Mask house 630 uses IC design layout diagram 622 to manufacture one or more masks 645 to be used for fabricating the various layers of IC device 660 according to IC design layout diagram 622. Mask house 630 performs mask data preparation 632, where IC design layout diagram 622 is translated into a representative data file ("RDF"). Mask data preparation 632 provides the RDF to mask fabrication 644. Mask fabrication 644 includes a mask writer. A mask writer converts the RDF to an image on a substrate, such as a mask (reticle) 645 or a semiconductor wafer 653. The design layout diagram 622 is manipulated by mask data preparation 632 to comply with particular characteristics of the mask writer and/or requirements of IC fab 650. In FIG. 6, mask data preparation 632 and mask fabrication 644 are illustrated as separate elements. In some embodiments, mask data preparation 632 and mask fabrication 644 can be collectively referred to as mask data preparation.

In some embodiments, mask data preparation 632 includes optical proximity correction (OPC) which uses lithography enhancement techniques to compensate for image errors, such as those that can arise from diffraction, interference, other process effects and the like. OPC adjusts IC design layout diagram 622. In some embodiments, mask data preparation 632 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 632 includes a mask rule checker (MRC) that checks the IC design layout diagram 622 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 622 to compensate for limitations during mask fabrication 644, which may undo part of the modifications performed by OPC in order to meet mask creation rules.

In some embodiments, mask data preparation 632 includes lithography process checking (LPC) that simulates processing that will be implemented by IC fab 650 to fabricate IC device 660. LPC simulates this processing based on IC design layout diagram 622 to create a simulated manufactured device, such as IC device 660. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 622.

It should be understood that the above description of mask data preparation 632 has been simplified for the purposes of clarity. In some embodiments, data preparation 632 includes additional features such as a logic operation (LOP) to modify the IC design layout diagram 622 according to manufacturing rules. Additionally, the processes applied to IC design layout diagram 622 during data preparation 632 may be executed in a variety of different orders.

After mask data preparation 632 and during mask fabrication 644, a mask 645 or a group of masks 645 are fabricated based on the modified IC design layout diagram 622. In some embodiments, mask fabrication 644 includes performing one or more lithographic exposures based on IC design layout diagram 622. In some embodiments, an electron-beam (e-beam) or a mechanism of multiple e-beams is used to form a pattern on a mask (photomask or reticle) 645 based on the modified IC design layout diagram 622. Mask 645 can be formed in various technologies. In some embodiments, mask 645 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 645 includes a transparent substrate (e.g., fused quartz) and an opaque material (e.g., chromium) coated in the opaque regions of the binary mask. In another example, mask 645 is formed using a phase shift technology. In a phase shift mask (PSM) version of mask 645, various features in the pattern formed on the phase shift mask are configured to have proper phase difference to enhance the resolution and imaging quality. In various examples, the phase shift mask can be attenuated PSM or alternating PSM. The mask(s) generated by mask fabrication 644 is used in a variety of processes. For example, such a mask(s) is used in an ion implantation process to form various doped regions in semiconductor wafer 653, in an etching process to form various etching regions in semiconductor wafer 653, and/or in other suitable processes.

IC fab 650 is an IC fabrication business that includes one or more manufacturing facilities for the fabrication of a variety of different IC products. In some embodiments, IC Fab 650 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 650 includes fabrication tools 652 configured to execute various manufacturing operations on semiconductor wafer 653 such that IC device 660 is fabricated in accordance with the mask(s), e.g., mask 645. In various embodiments, fabrication tools 652 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 650 uses mask(s) 645 fabricated by mask house 630 to fabricate IC device 660. Thus, IC fab 650 at least indirectly uses IC design layout diagram 622 to fabricate IC device 660. In some embodiments, semiconductor wafer 653 is fabricated by IC fab 650 using mask(s) 645 to form IC device 660. In some embodiments, the IC fabrication includes performing one or more lithographic exposures based at least indirectly on IC design layout diagram 622. Semiconductor wafer 653 includes a silicon substrate or other proper substrate having material layers formed thereon. Semiconductor wafer 653 further includes one or more of various doped regions, dielectric features, multi-level interconnects, and the like (formed at subsequent manufacturing steps).

Details regarding an integrated circuit (IC) manufacturing system (e.g., system 600 of FIG. 6), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

One general aspect includes a device. The device also includes a first dielectric layer over a device base layer, the first dielectric layer having a first opening therethrough, the first opening having a first sidewall; a first interconnect segment extending through the first opening; and a cap layer over a top surface of the first interconnect segment, where the cap layer may include a first metal, carbon, and nitrogen. Other embodiments of this aspect include corresponding computer systems, apparatus, and computer programs recorded on one or more computer storage devices, each configured to perform the actions of the methods.

Implementations may include one or more of the following features. The device may include: a second dielectric layer over the first dielectric layer and the first interconnect segment, where the second dielectric layer has a second opening extending therethrough; and a second interconnect segment extending through the second opening and electrically connected to the first interconnect segment. The cap layer is between the first interconnect segment from the second interconnect segment. The first metal may include cobalt. The liner layer is between the first sidewall of the first opening and the first interconnect segment; and a seed layer may include the first metal, where the seed layer is between the liner layer and the first interconnect segment. The first metal may include cobalt, and the second metal may include tantalum. The first dielectric layer may include a low-k dielectric layer. The first dielectric layer may include a porous low-k dielectric layer. The charge neutralization wash residue may include one or more of boron, fluorine, gallium, silver, and copper ranging from $1 \times 10^{16}$ atoms/ (cubic centimeter ($cm^3$)) to $1 \times 10^{17}$ atoms/($cm^3$). Implementations of the described techniques may include hardware, a method or process, or computer software on a computer-accessible medium.

One general aspect includes a method of making a semiconductor device. The method also includes depositing a first dielectric layer over a base layer of the semiconductor device; forming a first opening through the first dielectric layer to expose the base layer of the semiconductor device, forming a first interconnect segment in the first opening, forming a cap layer may include a first metal over a top surface of the interconnect segment, and modifying the cap layer to have an organometallic film. Other embodiments of this aspect include corresponding computer systems, apparatus, and computer programs recorded on one or more computer storage devices, each configured to perform the actions of the methods.

Implementations may include one or more of the following features. The method may include: depositing a liner layer in the first opening; and depositing a seed layer over the liner layer, where the seed layer may include the first metal. The first interconnect segment is exposed at a bottom of the second opening; and forming a second interconnect segment in the second opening. Modifying the cap layer further may include: binding ammonia to the top surface of the cap layer; reacting a portion of the ammonia with methyl radicals; and removing hydrogen from the ammonia and the methyl groups to form an organometallic film on the cap layer. Implementations of the described techniques may include hardware, a method or process, or computer software on a computer-accessible medium.

One general aspect includes a method of making a semiconductor device. The method also includes depositing a dielectric layer over an interconnect segment; forming an opening through the dielectric layer to expose the interconnect segment, where the opening forms a sidewall of the dielectric layer; neutralizing a charge buildup on the semiconductor device; depositing a liner on the sidewall of the dielectric layer; and filling the opening with a conductive material. Other embodiments of this aspect include corresponding computer systems, apparatus, and computer programs recorded on one or more computer storage devices, each configured to perform the actions of the methods.

Implementations may include one or more of the following features. The method may include depositing an etch stop layer over the interconnect segment, where forming an opening through a dielectric layer further may include etching through the dielectric layer to expose the etch stop layer, and etching partially through the etch stop layer; and neutralizing the charge buildup on the semiconductor device further may include etching partially through the etch stop layer to expose the interconnect segment. Neutralizing the charge buildup on the semiconductor device further may include applying a neutralization wash to the dielectric layer and the etch stop layer, and rinsing the neutralization wash from the dielectric layer and the etch stop layer after charge neutralization. The method neutralizing the charge buildup on the semiconductor device further may include: maintaining a pH of the neutralization wash between pH=8 and pH=12 during applying the neutralization wash to the dielectric layer and the etch stop layer; and maintaining a pH between pH=8 and pH=12 during rinsing the neutralization wash from the dielectric layer and the etch stop layer after charge neutralization. Neutralizing a charge buildup on the semiconductor device further may include: applying a charge neutralization wash having one or more of $BF_3$, $CO_2$, $SO_3^{2-}$, $Cu^+$, $Ag^+$, $GaCl_3$, $CN^-$, $RS^-$, and CO at a pH of not less than 8 and not more than 12. Neutralizing a charge buildup on the semiconductor device further may include rinsing with a basic solution having a pH of not less than 8 and not more than 12. Implementations of the described techniques may include hardware, a method or process, or computer software on a computer-accessible medium.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

We claim:

1. A method of making a semiconductor device, comprising:
   forming a first interconnect segment over a semiconductor substrate;
   forming a cap layer comprising a first metal over a top surface of the first interconnect segment; and
   modifying the cap layer to form an organometallic film, wherein modifying the cap layer comprises:
   adding ammonia to the top surface of the cap layer;
   reacting a portion of the ammonia with methyl radicals; and
   removing hydrogen from the ammonia and methyl groups of the methyl radicals to form the organometallic film on the cap layer.

2. The method according to claim 1, further comprising:
   depositing a first dielectric layer over the semiconductor substrate;
   forming a first opening through the first dielectric layer; and
   forming a first interconnect segment in the first opening.

3. The method according to claim 2, further comprising:
   exposing an upper surface of the semiconductor substrate in the first opening.

4. The method according to claim 3, further comprising:
   depositing a liner layer in the first opening; and
   depositing a seed layer over the liner layer,
   wherein the seed layer comprises the first metal.

5. The method according to claim 2, further comprising:
   depositing a second dielectric layer over the first dielectric layer;
   forming a second opening through the second dielectric layer, wherein an upper surface of the first interconnect segment is exposed at a bottom of the second opening; and
   forming a second interconnect segment in the second opening.

6. The method according to claim 2, further comprising:
   depositing an etch stop layer over a residual portion of the first dielectric layer and the first interconnect segment.

7. The method according to claim 6, further comprising:
   depositing a second dielectric layer over the etch stop layer;
   forming a second opening through the second dielectric layer; and
   neutralizing a charge accumulation on the semiconductor device.

8. The method according to claim 7, further comprising:
   forming a third opening through the etch stop layer to expose an upper surface of the cap layer; and
   depositing a liner layer over the second opening, the third opening, and the cap layer.

9. The method according to claim 8, further comprising:
   depositing a seed layer over the liner layer; and
   forming a second interconnect segment in the third opening.

10. The method according to claim 8, further comprising:
    depositing a seed layer over the liner layer; and
    forming a second interconnect segment in the second and third openings.

11. A method of making a semiconductor device, comprising:
    forming a first dielectric layer;
    etching the first dielectric layer to form a first opening;
    depositing a first interconnect segment in the first opening;
    depositing a second dielectric layer;
    etching the second dielectric layer to form a second opening having sidewalls wherein the second opening exposes a first portion of an upper surface of the first interconnect segment; and
    neutralizing a charge buildup on sidewalls of the second opening using a neutralization wash have a pH net less than 8 and not more than 12.

12. The method of making a semiconductor device according to claim 11, wherein neutralizing the charge build up comprises applying the neutralization wash comprising one or more of $BF_3$, $CO_2$, $SO_3^{2-}$, $Cu^+$, $Ag^+$, $GaCl_3$, $CN^-$, and CO to the sidewalls of the second opening.

13. The method of making a semiconductor device according to claim 11, wherein neutralizing the charge buildup further comprises:
   depositing a liner on the sidewall of the second dielectric layer; and
   filling the second opening with a conductive material to form a second interconnect segment.

14. The method according to claim 13, further comprising:
   positioning a first vertical axis of the first interconnect segment and a second vertical axis of the second interconnect segment whereby the first and second vertical axes are coaxial.

15. The method according to claim 13, further comprising:
   positioning a first vertical axis of the first interconnect segment and a second vertical axis of the second interconnect segment whereby the first and second vertical axes exhibit a horizontal offset.

16. The method according to claim 13, further comprising:
   positioning the first interconnect segment and the second interconnect segment to provide for a horizontally offset contact surface between first and second interconnect segments.

17. The method according to claim 13, further comprising:
   depositing a cap layer over the first interconnect segment;
   depositing an etch stop layer over the cap layer; and
   maintaining the neutralization wash for a wash period sufficient to remove a portion of the etch stop layer and expose a first portion of the cap layer.

18. A method of making a semiconductor device, comprising:
   forming a first dielectric layer;
   etching the first dielectric layer to form a first opening;
   depositing a first metal to form a first conductive segment in the first opening;
   depositing a second metal on the first conductive segment to form a cap layer; and
   modifying an upper portion of the cap layer to form an organometallic film, wherein modifying the upper portion of the cap layer comprises:
      adding ammonia to a top surface of the cap layer;
      reacting a portion of the ammonia with methyl radicals; and
      removing hydrogen from the ammonia and removing hydrogen from methyl groups of the methyl radicals to form the organometallic film on the cap layer.

19. The method of making a semiconductor device, according to claim 18, further comprising:
   depositing a second dielectric layer;
   etching the second dielectric layer to form a second opening; and
   depositing a second metal to form a second conductive segment in the second opening.

20. The method of making a semiconductor device, according to claim 19, further comprising:
   applying ammonia to the second opening before depositing the second metal.

* * * * *